United States Patent
Kies et al.

(10) Patent No.: US 10,551,984 B2
(45) Date of Patent: Feb. 4, 2020

(54) METHODS FOR DETECTING DEVICE CONTEXT IN ORDER TO ALTER TOUCH CAPACITANCE

(71) Applicant: QUALCOMM Incorporated, San Diego, CA (US)

(72) Inventors: Jonathan Kies, Encinitas, CA (US); Robyn Teresa Oliver, Escondido, CA (US); Robert Tartz, San Marcos, CA (US); Douglas Brems, San Diego, CA (US); Suhail Jalil, Poway, CA (US)

(73) Assignee: QUALCOMM Incorporated, San Diego, CA (US)

( * ) Notice: Subject to any disclaimer, the term of this patent is extended or adjusted under 35 U.S.C. 154(b) by 18 days.

(21) Appl. No.: 16/101,750

(22) Filed: Aug. 13, 2018

(65) Prior Publication Data

US 2019/0114005 A1  Apr. 18, 2019

Related U.S. Application Data

(60) Provisional application No. 62/572,460, filed on Oct. 14, 2017, provisional application No. 62/572,453, filed on Oct. 14, 2017, provisional application No. 62/572,465, filed on Oct. 14, 2017, provisional application No. 62/572,455, filed on Oct. 14, 2017, provisional application No. 62/572,471, filed on Oct. 14, 2017.

(51) Int. Cl.
*G06F 3/044* (2006.01)
*G06F 3/041* (2006.01)
(Continued)

(52) U.S. Cl.
CPC ............ *G06F 3/044* (2013.01); *G06F 1/3231* (2013.01); *G06F 3/013* (2013.01); *G06F 3/017* (2013.01); *G06F 3/03547* (2013.01); *G06F 3/041* (2013.01); *G06F 3/048* (2013.01); *G06F 3/0412* (2013.01); *G06F 3/0414* (2013.01); *G06F 3/0416* (2013.01); *G06F 3/0418* (2013.01);
(Continued)

(58) Field of Classification Search
None
See application file for complete search history.

(56) References Cited

U.S. PATENT DOCUMENTS 8,358,226 B2   1/2013   Reynolds et al.
8,854,320 B2   10/2014  Hirata et al.
(Continued)

OTHER PUBLICATIONS

International Search Report and Written Opinion—PCT/US2018/046656—ISA/EPO—dated Nov. 9, 2018, 13 pages.

*Primary Examiner* — Christopher J Kohlman
(74) *Attorney, Agent, or Firm* — The Marbury Law Group, PLLC

(57) ABSTRACT

Methods, devices, non-transitory processor-readable media of various embodiments may enable contextual operation of a mobile computing device including a capacitive input sensor, which may be a rear area capacitive input sensor. In various embodiments, a processor of a mobile computing device including a rear area capacitive input sensor may monitor sensor measurements and generate an interaction profile based on the sensor measurements. The processor of the mobile computing device may determine whether the interaction profile is inconsistent with in-hand operation and may increase sensitivity of the capacitive input sensor in response to determining that the interaction profile is inconsistent with in-hand operation.

34 Claims, 8 Drawing Sheets

(51) Int. Cl.
*G06F 3/0488* (2013.01)
*G06F 3/048* (2013.01)
*G06F 1/3231* (2019.01)
*G06F 3/01* (2006.01)
*H03K 17/96* (2006.01)
*G06F 3/0354* (2013.01)

(52) U.S. Cl.
CPC ........ *G06F 3/0488* (2013.01); *G06F 3/04883* (2013.01); *H03K 17/9622* (2013.01); *G06F 2203/04104* (2013.01); *G06F 2203/04106* (2013.01)

(56) References Cited

U.S. PATENT DOCUMENTS

| | | |
|---|---|---|
| 8,988,356 B2 | 3/2015 | Tseng |
| 9,152,271 B2 | 10/2015 | Schmidt et al. |
| 9,557,846 B2 | 1/2017 | Baharav et al. |
| 9,588,629 B2 | 3/2017 | Jordan et al. |
| 9,772,764 B2 | 9/2017 | Elyada et al. |
| 2006/0197750 A1 | 9/2006 | Kerr et al. |
| 2011/0053641 A1 | 3/2011 | Lee et al. |
| 2011/0087963 A1 | 4/2011 | Brisebois et al. |
| 2012/0139860 A1 | 6/2012 | Hotelling et al. |
| 2012/0268411 A1 | 10/2012 | Chen et al. |
| 2012/0271545 A1 | 10/2012 | Cheng et al. |
| 2013/0106710 A1* | 5/2013 | Ashbrook ............. G06F 3/0488 345/173 |
| 2013/0265276 A1 | 10/2013 | Obeidat et al. |
| 2014/0078086 A1 | 3/2014 | Bledsoe et al. |
| 2015/0042588 A1 | 2/2015 | Park et al. |
| 2015/0128078 A1 | 5/2015 | Oh et al. |
| 2015/0177945 A1 | 6/2015 | Sengupta et al. |
| 2016/0212710 A1 | 7/2016 | Ting et al. |
| 2016/0239148 A1 | 8/2016 | Lee et al. |
| 2016/0282988 A1 | 9/2016 | Poupyrev |
| 2016/0291731 A1 | 10/2016 | Liu et al. |
| 2017/0046125 A1 | 2/2017 | Gargi et al. |
| 2017/0115782 A1 | 4/2017 | Hinckley et al. |
| 2019/0113995 A1 | 4/2019 | Kies et al. |
| 2019/0114021 A1 | 4/2019 | Oliver et al. |

\* cited by examiner

METHODS FOR DETECTING DEVICE CONTEXT IN ORDER TO ALTER TOUCH CAPACITANCE

RELATED APPLICATIONS

This application claims the benefit of priority to U.S. Provisional Patent Application Ser. 62/572,460 entitled "Methods For Detecting Device Context In Order To Alter Touch Capacitance" filed on Oct. 14, 2017, to U.S. Provisional Patent Application Ser. No. 62/572,453 entitled "Managing And Mapping Multi-Sided Touch" filed on Oct. 14, 2017, to U.S. Provisional Patent Application Ser. No. 62/572,465 entitled "Methods For Integrating Multi-Touch Across Rear/Side Surfaces And A Front Display" filed on Oct. 14, 2017, to U.S. Provisional Patent Application Ser. 62/572,455 entitled "Methods of Direct Manipulation of Multi-Layered User Interfaces" filed on Oct. 14, 2017, and to U.S. Provisional Patent Application Ser. No. 62/572,471 entitled "Method And Apparatus To Accommodate Both Wireless Charging And Back Touch Sensing" filed on Oct. 14, 2017. The contents of these documents are incorporated herein by reference.

BACKGROUND

Mobile computing devices may use a wide variety of input methods. In addition to buttons and other physical input devices, mobile computing devices typically include an electronic display capable of detecting the presence and location of the touch within the display area (i.e., a "touchscreen"). Numerous software applications for mobile computing devices make use of touchscreen inputs, and thus touchscreens have dramatically expanded the type and range of possible user interactions with mobile computing devices.

However, touchscreen interactions require the user's focused attention to see a target to touch (e.g., an icon, text, etc.) or a response to the input. Further, more complex software applications may be difficult or cumbersome to control through interactions with a touchscreen. Moreover, many interactions with mobile computing devices require one hand to hold the mobile computing device so that fingers of the other hand may interact with the touchscreen. Such interactions may be difficult or impossible in certain situations, such as when the mobile computing device is in a bag, pocket or case.

SUMMARY

The methods, devices, non-transitory processor-readable media of various embodiments may enable contextual operation of a mobile computing device including a rear area capacitive input sensor. In various embodiments, a processor of a mobile computing device including a rear area capacitive input sensor may monitor sensor measurements and generate an interaction profile based on the sensor measurements. The processor of the mobile computing device may determine whether the interaction profile is inconsistent with in-hand operation, and may increase sensitivity of the rear area capacitive input sensor in response to determining that the interaction profile is inconsistent with in-hand operation. In some embodiments, the processor of the mobile computing device may determine whether the mobile computing device is in a put-away state (e.g., in a bag, pocket, or case) and may operate the mobile computing device in a put-away mode (i.e., a mode suitable for interacting with the device while it is in a bag pocket or case) in response to determining that the mobile computing device is in the put-away state.

Various embodiments may include generating an interaction profile based on sensor measurements, determining whether the interaction profile is inconsistent with in-hand operation, determining whether the mobile computing device is in a put-away state in response to determining that the interaction profile is inconsistent with in-hand operation, operating the mobile computing device in a put-away mode and increasing a sensitivity of a capacitive input sensor in response to determining that the mobile computing device is in the put-away state in which the mobile computing device uses a first gesture profile in the put-away mode that is different than a second gesture profile used in a normal mode. In some embodiments, the sensor measurements may be received from one or more of the capacitive input sensor, another capacitive sensor, an accelerometer, a camera, a microphone, a gyroscope, a heat sensor, an ambient light sensor, or a bolometer.

In some embodiments, the first gesture profile and the second gesture profile may be configured such that the mobile computing device performs an operation in response to a selected user interaction with the capacitive input sensor in the put-away state that is different from an operation performed by the mobile computing device in response to the same selected user interaction in the normal state.

In some embodiments, in response to the selected user interactions being one or more of a touch, a gesture, or a grip, the operation of the mobile computing device may be an operation to answer a call, start an application, silence an alert, turn on a screen, read out a message, read out a caller name, launch a camera, toggle a silent mode, adjust a volume, or control another device. In some embodiments, in response to the selected user interactions being one or more of a touch, a gesture, or a grip, the operation of the mobile computing device may control a wearable device. In some embodiments, the wearable device may be a virtual reality head-mounted display or augmented reality glasses.

In various embodiments, a processor of a mobile computing device including a rear area capacitive input sensor may monitor rear area capacitive input sensor measurements and generate a capacitive profile based on the rear area capacitive input sensor measurements. The processor of the mobile computing device may determine whether the capacitive profile is non-finger shaped, and may increase sensitivity of the rear area capacitive input sensor in response to determining that the capacitive profile is non-finger shaped. In some embodiments, the processor of the mobile computing device may monitor one or more other sensor outputs in response to determining that the capacitive profile is non-finger shaped. The processor of the mobile computing device may determine whether the one or more other sensor outputs indicate the mobile computing device is in a put-away state (e.g., in a bag, pocket, or case) and may operate the mobile computing device in a put-away mode (i.e., a mode suitable for interacting with the device while it is in a bag pocket or case) in response to determining that the one or more other sensor outputs indicate the mobile computing device is in the put-away state.

In some embodiments, the one or more other sensor outputs may be received by the processor from one or more of an accelerometer, a camera, a microphone, a gyroscope, a heat sensor, an ambient light sensor, or a bolometer.

Some embodiments may further include determining a surface of the mobile computing device that is an outward surface in the put-away state based at least in part on the one or more other sensor outputs, and increasing a sensitivity of a capacitive sensor positioned on the outward surface. In some embodiments, the capacitive input sensor may be a rear area capacitive input sensor.

In some embodiments, in the first gesture profile an image associated with an operation of the mobile computing device may be not displayed on a screen of the mobile computing device and in the second gesture profile the image associated with the operation may be displayed on the screen of the mobile computing device, in which the screen is a front screen on a side opposite of the rear area capacitive input sensor.

Some embodiments may further include determining whether additional one or more other sensor outputs indicate the mobile computing device is in a normal state while the mobile computing device is operating in the put-away mode, and operating the mobile computing device in the normal mode in response to determining that the additional one or more other sensor outputs indicate the mobile computing device is in the normal state.

Various embodiments include a mobile computing device including a rear area capacitive input sensor and a processor configured with processor-executable instructions to perform operations of the methods summarized above. Various embodiments also include a non-transitory processor-readable medium on which is stored processor-executable instructions configured to cause a processor of a mobile computing device to perform operations of the methods summarized above. Various embodiments also include a mobile computing device including a rear area capacitive input sensor and means for performing functions of the methods summarized above.

BRIEF DESCRIPTION OF THE DRAWINGS

The accompanying drawings, which are incorporated herein and constitute part of this specification, illustrate exemplary embodiments of the invention, and together with the general description given and the detailed description, serve to explain the features herein.

DETAILED DESCRIPTION

Figure 1A:
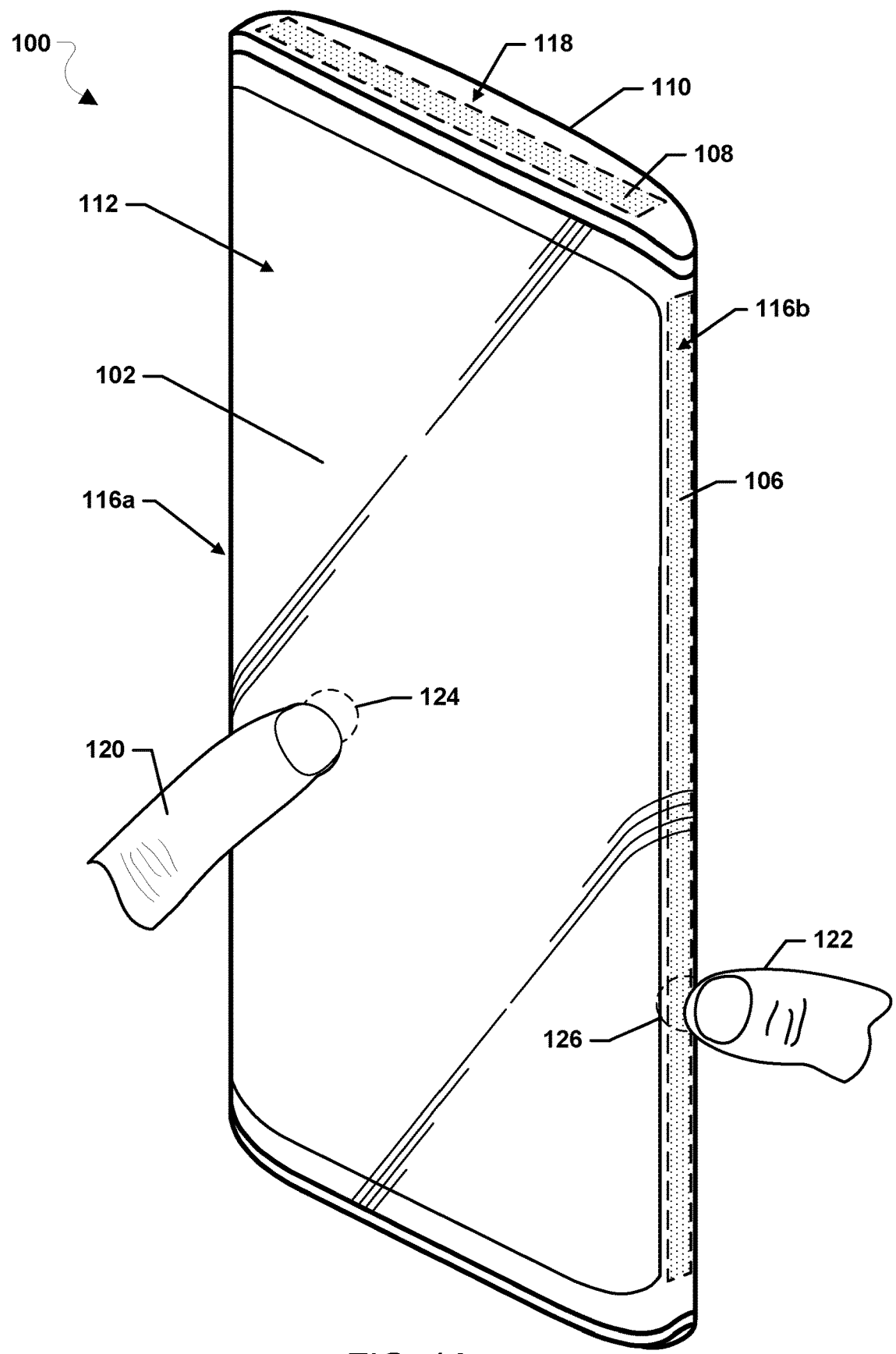
FIGS. 1A and 1B are schematic block diagrams illustrating an example mobile computing device that is suitable for implementing various embodiments.

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims.

The terms "computing device" and "mobile computing device" are used interchangeably herein to refer to any one or all of variety of small computing devices, particularly computing devices including a touchscreen display that reaches to or over an edge of the display, a programmable processor and memory and circuitry for receiving user inputs. Examples of computing devices for which the various embodiments are particularly useful include mobile communication devices or "smartphones," and table computing devices configured to be held on the edges by a user.

Many user interactions with a mobile computing device require one hand to hold the mobile computing device so that fingers of the other hand can interact with the touchscreen. Such interactions may be difficult or impossible in certain situations, such as when the mobile computing device is in a bag, pocket, or case. Many users carry a mobile computing device in a pocket or a bag, and many mobile computing devices are enclosed in a protective case. The front screen of a mobile computing device may not be accessible to the user while the mobile computing device is in put-away state, such as in a pocket, a bag or a protective case.

The methods, devices, non-transitory processor-readable media of various embodiments may enable contextual operation of a mobile computing device including a capacitive input sensor while the mobile computing device is not in a user's hand, such as put-away in a pocket or purse. In various embodiments, a mobile computing device may be configured to distinguish a first operational context from a second operational context. As an example, the first operational context may be a normal use state and the second operational context may be a put-away state. As another example, the first operational context may be a put-away state and the second operational context may be a normal use state. As another example, the first operational context may be a normal use state and the second operational context may be the mobile computing device enclosed within a barrier, such as a case, sleeve, etc., covering at least some of the capacitive input sensors. Such determinations to distinguish between the first operational context and the second operational context may be made, for example, based at least in part on capacitive input sensor measurements and/or other sensor inputs, context, or user indications. Based on the determined operational context, the mobile computing device may change a sensitivity of the capacitive input sensor and may enable different user interactions with the capacitive input sensor than may be enabled in other operational contexts.

In various embodiments, based on the determined operational context, different gesture profiles may be used on the mobile computing device to control how the mobile computing device responds to different user interactions based on the operational context. Gesture profiles may associate user interface functions of a mobile computing device with operating modes of the mobile computing device. In different gesture profiles, operations of a mobile device may be controlled differently in response to the same user interaction with the mobile computing device. For example, a put-away mode and a normal mode may have different gesture profiles. A user interaction, such as a touch, with a capacitive input sensor in a put-away mode may silence an alert according to the put-away mode gesture profile, while the same user interaction, such the same type of touch, with the capacitive input sensor in a normal mode may cause a screen to display information about the alert according to the normal mode gesture profile. In different gesture profiles, operations of a mobile device may be different, regardless of user interactions. For example, in a put-away mode the put-away gesture profile may prevent the display of notifications on a screen of the mobile computing device, while in the normal mode the normal gesture profile may cause notifications to be displayed on the screen.

In various embodiments, a processor of a mobile computing device including a capacitive input sensor may monitor sensor measurements and generate an interaction profile based on the sensor measurements. An interaction profile may be a mapping of one or more sensor measurement. Interaction profiles may include capacitive profiles generated based on capacitive sensor measurements, acceleration profiles generated based on accelerometer measurements, image profiles based on outputs from a camera, audio profiles based on outputs from a microphone, angular velocity profiles based on gyroscope measurements, temperature profiles based on heat sensor measurements, light profiles based on ambient light sensor measurements, electromagnetic profiles based on bolometer measurements, combination profiles based on measurements from two or more different type of sensors, or any other type of profile generated based on sensor measurements. As a specific example, a processor of a mobile computing device including a capacitive input sensor may monitor capacitive input sensor measurements and generate a capacitive profile based on the rear area capacitive input sensor measurements. The processor of the mobile computing device may generate a capacitive profile based on the capacitive input sensor measurements by mapping capacitance levels measured by the rear area capacitive input sensor that are at or above a threshold. All, or a portion, of the map of the capacitance levels may be used as the capacitive profile.

In various embodiments, the processor of the mobile computing device may determine whether the interaction profile is inconsistent with in-hand operation. One or more interaction profiles may be associated with in-hand operation, such as capacitive profiles being associated with one or more fingers touching a mobile computing device, temperature profiles being associated with the temperature of a mobile computing device when held in a hand, etc., and/or one or more interaction profiles may be inconsistent with in-hand operation (e.g., not associated with in-hand operation, associated with an operational state other than being held, etc.), such as a capacitive profile being non-finger shaped, a light profile being darker or lighter than expected for in-hand operation, etc. The processor of the mobile computing device may determine whether the interaction profile is inconsistent with in-hand operation by comparing the interaction profile to stored interaction profiles associated with in-hand operation, as well as other predictable modes of operation (e.g., on a surface, in a case, in a pants pocket, in a coat pocket, in a purse or bag, etc.).

The processor of the mobile computing device may determine whether the interaction profile is inconsistent with in-hand operation by comparing the interaction profile to stored interaction profiles associated with in-hand operation. Examples of stored interaction profiles include one or more of capacitive profiles associated with a mobile computing device being held (e.g., capacitive profiles of fingers and/or other parts of a hand touching a mobile computing device when the mobile computing device is held), acceleration profiles associated with a mobile computing device being held, image profiles of fingers or other parts of a hand, audio profiles associated with a mobile computing device being held, angular velocity profiles associated with a mobile computing device being held, temperature profiles associated with a mobile computing device being held, light profiles associated with a mobile computing device being held, electromagnetic profiles associated with a mobile computing device being held, etc. As an example, a capacitive profile associated with a mobile computing device being held may be a capacitive profile of a finger that may be a mapping of capacitive sensor measurements associated with a finger touching a mobile computing device. An example of an acceleration profile associated with a mobile computing device being held may be a mapping of accelerometer measurements associated with typical movements of a mobile computing device experienced by the mobile computing device while being held by a user. An example of an image profile associated with a mobile computing device being held may be a photograph of a finger or other part of a hand taken by a camera while a mobile computing device is being held by a user. An example of an audio profile associated with a mobile computing device being held may be a recording of a sound of a finger or other part of a hand touching a mobile computing device while being held by a user. An example of an angular velocity profile associated with a mobile computing device being held may be a gyroscope measurement associated with typical movements of a mobile computing device while being held by a user. An example of a temperature profile associated with a mobile computing device being held may be a heat sensor measurement of a value, below or above a value, or within a range of values of temperature associated with a mobile computing device being held. An example of a light profile associated with a mobile computing device being held may be an ambient light sensor measurement associated with a finger or other part of a hand touching a mobile computing device while being held by a user. An example of an electromagnetic profile associated with a mobile computing device being held may be a bolometer measurement associated device typical electromagnetic field associated with a hand of a user holding the mobile computing device.

In various embodiments, the processor of the mobile computing device may compare an interaction profile generated based on one or more sensor measurements to one or more interaction profiles stored in a memory to determine whether the interaction profile is inconsistent with in-hand operation. In response to the interaction profile matching a stored interaction profile associated with other than in-hand operation (or in response to the interaction profile not matching any interaction profiles associated with in-hand operation), the processor of the mobile computing device may determine that the interaction profile is inconsistent with in-hand operation. In response to the interaction profile matching a stored interaction profile associated with in-hand operation, the processor of the mobile computing device may determine that the interaction profile is consistent with in-hand operation.

As a specific example, when the interaction profile is a capacitive profile, in response to the capacitive profile not matching any capacitive profiles of fingers (or matching a capacitive profile that is non-finger shaped), the processor of the mobile computing device may determine that the capacitive profile is non-finger shaped and accordingly inconsistent with in-hand operation. In response to the capacitive profile matching a stored capacitive profile of a finger, the processor of the mobile computing device may determine the capacitive profile is finger shaped and accordingly consistent with in-hand operation.

As an example, a key in a pocket or bag touching the rear area capacitive input sensor may result in a non-finger shaped profile being generated and the non-finger shaped interaction profile may be determined to be inconsistent with in-hand operation. As another example, a case on the mobile computing device covering all or a portion of the rear area capacitive input sensor may result in a non-finger shaped profile being generated and the non-finger shaped interaction profile may be determined to be inconsistent with in-hand operation. As a further example, the cloth of a pocket or bag touching the rear area capacitive input sensor may result in a non-finger shaped profile being generated and the non-finger shaped interaction profile may be determined to be inconsistent with in-hand operation.

In some embodiments, various examples or a parametric description of outputs from sensors, such as a capacitive input sensor, an accelerometer, a camera, a microphone, a gyroscope, a heat sensor, an ambient light sensor, a bolometer, etc., when the mobile computing device is operated in a hand of a user (e.g., touched by a finger, touched by a portion of a hand, etc.) may be preloaded in memory during fabrication or assembly of the mobile computing device, memory chips, the sensors, or other components. In some embodiments, a user may train the mobile computing device and/or the capacitive input sensor to recognize that the mobile computing device is operated in a hand of a user (e.g., the user's fingers touching the sensor, the user's hand touching the mobile computing device, etc.), such as through a calibration or registration process (e.g., similar to training a finger print reader or other biometric reader). In some embodiments, the mobile computing device, memory chips, the sensors (e.g., capacitive input sensors, accelerometers, cameras, microphones, gyroscopes, heat sensors, ambient light sensors, bolometers, etc.), or other components may be preloaded with a default set of examples or parametric descriptions of sensor outputs when the mobile computing device is operated in a hand of a user (e.g., one or more fingers are touching the sensor, one or more portions of the user's hand are touching the mobile computing device, etc.). Such reloaded examples or parametric descriptions of sensor outputs may be supplemented or overwritten during a user calibration or registration process. Similarly, the mobile computing device, memory chips, the sensors (e.g., capacitive input sensors, accelerometers, cameras, microphones, gyroscopes, heat sensors, ambient light sensors, bolometers, etc.), or other components may be configured to determine when the mobile computing device has been enclosed or partially enclosed by a barrier, such as a case, sleeve, etc.

In various embodiments, a processor of a mobile computing device may increase a sensitivity of the capacitive input sensor in response to determining that the interaction profile (e.g., capacitive profile, acceleration profile, image profile, audio profile, angular velocity profile, temperature profiles, light profile, electromagnetic profile, etc.) is inconsistent with in-hand operation (e.g., non-finger shaped or that the mobile computing device has been enclosed or partially enclosed by a barrier, such as a case, sleeve, etc.) For example, the processor of the mobile computing device may increase the sensitivity by increasing a gain of the capacitive input sensor. As another example, the processor of the mobile computing device may increase the sensitivity by adjusting controllable capacitance values for the capacitive input sensor. As another example, the processor of the mobile computing device may increase the sensitivity by by making any other hardware and/or software adjustment of the rear area capacitive input sensor that results in increased sensitivity. The increase in sensitivity may enable the capacitive input sensor to be operated through the back wall of a case, through a sleeve (e.g., through a screen cover, wrap, etc.), through leather of a bag, cloth of a pocket, or other materials that may be covering some or all of the rear area capacitive input sensor. This increased sensitivity may enable the capacitive input sensor to recognize a user's touch and gestures through the outside of his or her pocket, bag, phone case, or other structure in which the mobile computing device may be "put away." Thus, by increasing the sensitivity of the capacitive input sensor, the user may be able to interact with the capacitive input sensor while the mobile computing device is otherwise in a put-away state, such as interacting with a rear area capacitive input sensor that is covered by a barrier, such as a case, sleeve, etc.

In various embodiments, the processor of the mobile computing device may monitor one or more sensor outputs in response to determining that the interaction profile, such as the capacitive profile, the acceleration profile, the image profile, the audio profile, the angular velocity profile, the temperature profiles, the light profile, the electromagnetic profile, etc., is inconsistent with in-hand operation. As discussed above, the processor may monitor, singularly or in any combination, capacitive sensor outputs, accelerometer outputs, camera outputs, touch screen outputs, microphone outputs, pressure sensor outputs, gyroscope outputs, heat sensor outputs, ambient light sensor outputs, and bolometer outputs, or outputs of any other type sensors available on the mobile computing device. Additionally, a sensor output may be an indication of whether a front screen is on or off.

In various embodiments, the processor of the mobile computing device may determine whether one or more sensor outputs indicate the mobile computing device is in a put-away state or enclosed by a barrier, such as in a case, wrapped by a sleeve or other covering, etc. For example, one or more of the outputs of the sensors may be compared to one or more thresholds, singularly or in combination, and the one or more of the outputs being above or below the thresholds may indicate the mobile computing device is in a put-away state. As a specific example, a camera sensing a threshold level of darkness for a period time while accelerometer movements are detected may indicate the mobile computing device is in a closed bag or pocket. As another example, a microphone output being consistent with the shuffling and muffling sounds typical in a pocket or bag may indicate the mobile computing device is in a pocket or bag. As a further example, a heat sensor output being slightly elevated while other sensor outputs remain in normal operating condition output ranges may indicate the mobile computing device has been placed in a protective case or other covering.

In some embodiments, the processor of the mobile computing device may be configured to learn various user-designated put-away states, such as through a calibration or registration process in which the user places the mobile computing device in a particular put-away state long enough to enable the processor to gather various sensor data to be correlated to the particular put-away state. Such sensor data may be stored in memory and subsequently used as thresholds for determining when the mobile computing device is in a put-away state.

In some embodiments, the processor of the mobile computing device may be configured to distinguish between different put-away states, such as by monitoring sensor outputs to distinguish a first put-away state from a second put-away state. For example, sensor data from a heat sensor may distinguish the mobile computing device being in a put-away state associated with being in a purse or bag from a put-away state in a pocket because the pocket may be associated with a higher temperature threshold.

In some embodiments, the processor of the mobile computing device may be configured to determine which surface of the mobile computing device is facing outward or upward in a particular put-away state (e.g., away from a user's body in a pocket, etc.) based on the sensor outputs. For example, outputs from a heat sensor used by the processor to detect the surface that is warmest and the processor may indicate the surface that is opposite the warmest surface as the outward facing surface. As another example, data generated by ambient light sensors may be used by the processor to determine the surface that is darkest (or lightest), and the processor may indicate that the outward facing surface is the lightest surface or the surface opposite to the darkest surface.

In some embodiments, the processor of the mobile computing device may be configured to determine the surface of the mobile computing device that is covered by a barrier, such as a protective case or other covering. For example, outputs from a heat sensor may be used by the processor to detect an elevated temperature on a surface of the mobile computing device while other sensor outputs indicate lower temperatures or temperatures in a normal operating range. The processor may determine that the surface with the elevated temperature is the surface covered by a barrier, such as a protective case or other covering.

In various embodiments, the processor of the mobile computing device may select a gesture profile for use by the mobile computing device based on the operational context of the mobile computing device. Different gesture profiles may be associated with different put-away states, and based on determining the type of put-away state, the processor of the mobile computing device may select a gesture profile associated with that put-away state type. For example, sensor outputs, such as heat sensor outputs, light sensor outputs, accelerometer outputs, etc., may be used by the processor of the mobile computing device in different operating modes to select a gesture profile to use in interpreting various user inputs, such as touches on a capacitive input sensor. As a specific example, heat sensor and light sensor outputs in a put-away mode may distinguish between the put-away state being in a bag and the put-away state being in a pocket and the gesture profile for the pocket put-away state or gesture profile for the bag put-away state may be selected by the processor for use by the mobile computing device accordingly.

In various embodiments, the processor of the mobile computing device may operate the mobile computing device in a put-away mode in response to determining that the one or more sensor outputs indicate the mobile computing device is in the put-away state. For ease of reference, any operating mode in which the sensitivity of a capacitive input sensor (e.g., a rear area sensor) is increased to account for a covering, such as a case, sleeve, etc., is referred to herein as a "put-away mode," even though the mobile computing device may still be in use, such as may be the case when the rear area is covered by a protective case or sleeve.

In various embodiments, a put-away mode may be a mode of operation in which selected user interactions with the capacitive input sensor may be enabled to control the operation of the mobile computing device. In various embodiments, the selected user interactions may be different user interactions with the capacitive input sensor than may be enabled in other operational contexts (e.g., normal, non-stowed operation). In some embodiments, the processor of the mobile computing device may be configured to learn various user-designated put-away modes, such as through a calibration or registration process in which the user links preferred interactions to various functions, device states, etc.

In some embodiments, the processor of the mobile computing device may be configured to adjust an operating state of the hardware of the mobile computing device in various put-away modes. For example, in a put-away mode the mobile computing device processor may activate and/or increase the sensitivity of the capacitive input sensor on a surface of the mobile computing device determined to be the outward or upward facing surface and/or to be the surface covered by a protective case or other covering. As another example, in a put-away mode the mobile computing device processor may cease the display of icons or other graphical elements on the screen(s) of the mobile computing device.

An example of selected user interactions that may be enabled in a put-away mode includes allowing a user to apply a gesture to a rear area capacitive input sensor to turn off the ringer/vibration when the mobile computing device is ringing/vibrating. Another example of selected user interactions that may be enabled in a put-away mode includes using a tap or touch on the capacitive input sensor through the outside of pants or a bag to cause the mobile computing device to read out who the call is coming from. Another example of selected user interactions that may be enabled in a put-away mode includes touches or gestures on a rear area capacitive input sensor to toggle silent mode. Another example of selected user interactions that may be enabled in a put-away mode includes touches or gestures on a rear area capacitive input sensor to increase/decrease ringer volume. Another example of selected user interactions that may be enabled in a put-away mode includes touches or gestures on a rear area capacitive input sensor to read out the current time.

The selected user interactions in the put-away mode, as well as other modes of operation, may be defined in a gesture profile. Gesture profiles may associate user interface functions of a mobile computing device with operating modes of the mobile computing device. In different gesture profiles, operations of a mobile device may be controlled differently in response to the same user interaction with the mobile computing device. For example, in the gesture profile associated with a pocket put-away mode, a given touch or gesture on a rear area capacitive input sensor may toggle silent mode; in the gesture profile associated with a bag or purse put-away mode, the same touch or gesture on a rear area capacitive input sensor may cause the mobile computing device to read out who is calling when the phone is ringing; and in the gesture profile associated with a normal mode, the same touch or gesture on a rear area capacitive input sensor may enlarge the text on a screen of the mobile computing device.

In embodiments in which the mobile computing device may be connected to another device, selected user interactions with a rear area capacitive input sensor that may be enabled in a put-away mode may include allowing touches or gestures to the rear area capacitive sensor to control the interaction with that other device. In some embodiments, the other device may be a wearable device. An example of a wearable device suitable for use with various embodiments is a virtual reality (VR) head-mounted display (HMD). Another example of a wearable device suitable for use with various embodiments is augmented reality (AR) glasses. As an illustrative example, when a pair of AR glasses is showing content, taps on the rear area capacitive input sensor of a pocketed or encased mobile computing device may be interpreted by the processor to show/hide AR content, move content, etc.

In various embodiments, the processor of the mobile computing device may determine when the operating state changes from put-away mode to normal mode by monitoring the output of one or more sensors of the mobile computing device. For example, a light level change detected by a light meter or camera may be used by the processor of the mobile computing device to conclude that the mobile computing device has been removed from a pocket or a bag. As another example, an accelerometer detecting a change in acceleration may be used by the processor of the mobile computing device to conclude the mobile computing device has been removed from a pocket or a bag.

In response to determining that one or more sensor outputs indicate that the operating state has changed from put-away to normal, the processor of the computing device may change the operating mode to the normal mode. In various embodiments, in response to changing to the normal mode, the processor may use a normal mode gesture profile to determine appropriate functions or responses to various touch inputs. For example, the processor of the mobile computing device may decrease the sensitivity of the capacitive input sensor.

Additionally, in the put-away mode the processor may alter mobile computing device behavior by not illuminating lights or the display and/or making sounds for alerts until the device is out of the put-away state. For example, once the mobile computing device is out of the pocket or the bag, the processor may return display and sound functionality to normal. As another example, the processor may turn on the front screen in response to the bag being opened or the mobile computing device exiting a pocket, which may be determined when the light meter detects a large change in light levels after a sustained period of darkness. Optionally, in a put-away mode, the user may be given the option to only use vibrate when the mobile computing device is in a pocket.

Additionally, certain gestures may have specific responses in put-away mode. For example, in put-away mode a whole hand touch of a rear area capacitive input sensor through the outside of pants may turn off the ringer as it rings. As another example, in put-away mode, stroke or multi-stroke gestures may be performed on the rear area capacitive input sensor to automatically launch specific applications or perform specific actions when the screen is off or on. For example, drawing a "C" with the index finger on the rear area capacitive input sensor when the screen is off may launch the camera. Gripping the mobile computing device in particular ways when the screen is off when in put-away mode may automatically launch an associated application. For example, gripping the mobile computing device with both hands in portrait orientation in a put-away mode, as may be sensed by side mounted capacitive input sensors, may launch a messaging application and either allow the user to readily reply to a recent message, or if there was no recent message, allow composing a new message. As another example, gripping the mobile computing device with both hands on the edges, as may be sensed by side mounted capacitive input sensors, and turning it vertically in the put-away mode may launch the camera. As a further example, gripping the mobile computing device with both hands while the rear area capacitive input sensor rests on the index fingers in put-away mode may launch the media player application, a gallery application, or a gaming application based on user preferences.

As described below, a mobile computing device may have capacitive input sensors on each surface, including rear area capacitive input sensors, side capacitive input sensors, top capacitive input sensors, and bottom capacitive input sensors, in addition to the normal touchscreen display on the front surface. Any and all of the capacitive input sensors may be involved in various embodiments. For ease of describing various embodiments, the descriptions may only refer to rear area capacitive input sensors as such sensors have general applicability. However, such references are not intended to limit the claims to just rear area capacitive sensors unless so recited in the claims.

Various examples of touch input sensors are discussed herein, specifically capacitive input sensors. The references to capacitive input sensors are provided merely as examples to better illustrate the aspects of the various embodiments, and are not intended to limit the various embodiments in any way. Other touch input sensors, such as resistive input sensors, infrared input sensors, etc., may be used with the various embodiments, and the other touch input sensors may be substituted in the various examples without departing from the spirit or scope of the invention. As one example, rather than a capacitive profile being generated and determined to be non-finger shaped, another profile type associated with other touch input sensors (e.g., a resistive profile, an infrared profile, etc.) may be generated and determined to be non-finger shaped.

Figure 1B:
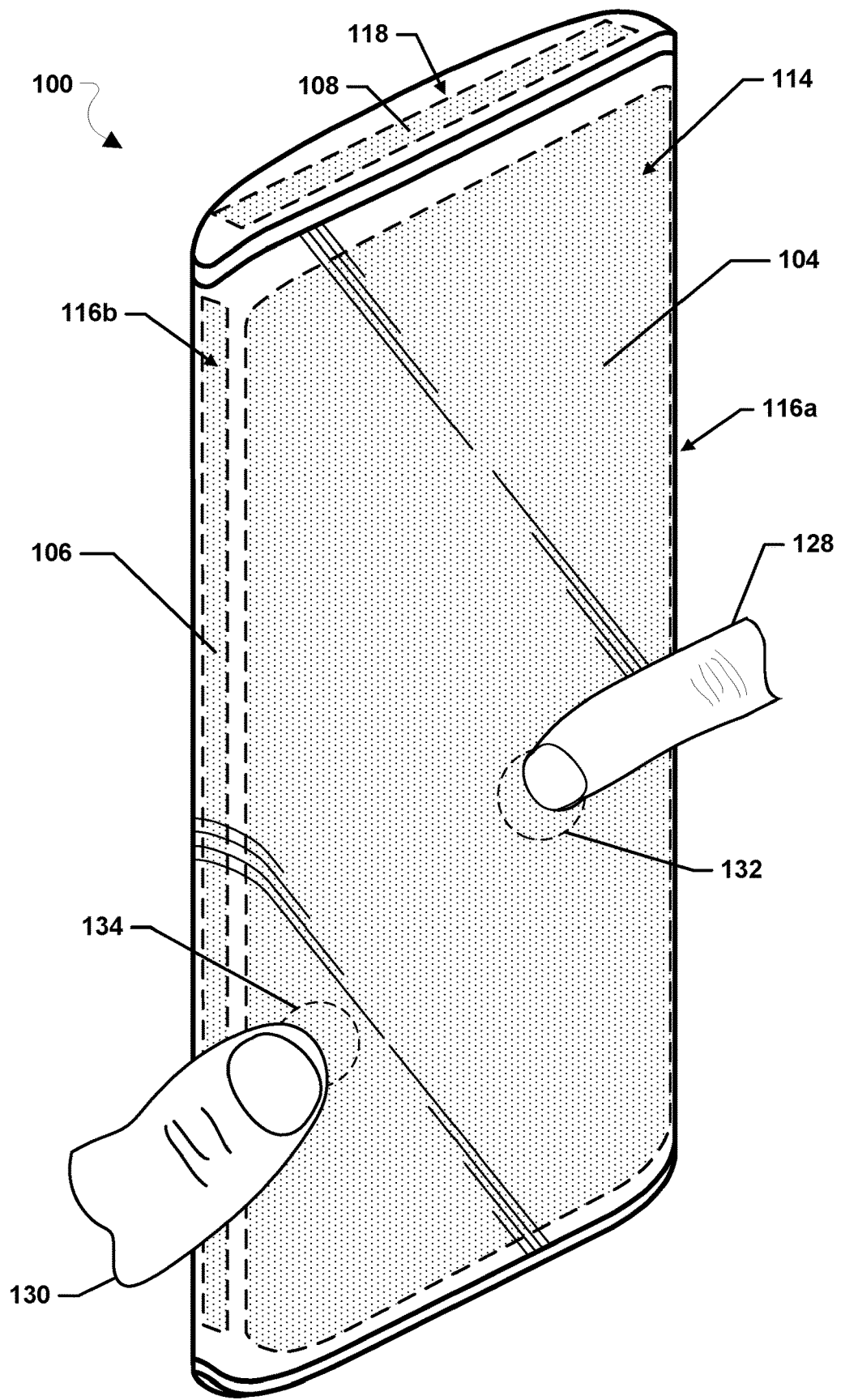

Various embodiments may be implemented within a variety of mobile computing devices, an example of which is illustrated in FIGS. 1A and 1B. With reference to FIGS. 1A and 1B, a mobile computing device 100 may include a body 110 having a front area 112, a rear area 114, two sides 116a, 116b between the front area 112 and the rear area 114, and a top area 118 between the front area 112 and the rear area 114. The front area 112 may include a capacitive input sensor 102 that may be incorporated within a display in the form of a touchscreen display. The rear area 114 may include a capacitive input sensor 104. One or both of the sides 116a, 116b may include a capacitive input sensor 106. The top area 118 may include a capacitive input sensor 108. Thus, the body 110 of the mobile computing device 100 may include one or more capacitive input sensors on the front area 112, the rear area 114, the one or more sides 116a, 116b, and the top area 118. The capacitive input sensors 102, 104, 106, 108 may be configured to receive an input 124, 132 from a user's finger 120, 128 and/or an input 126, 134 from a user's thumb 122, 130.

A capacitive input sensor 102, 104, 106, 108 is configured to detect a change in capacitance at a location where the sensor is touched (or nearly touched) by an object, particularly by a user's hand, thumb or fingers. While finger and thumb touches 124, 126, 132, and 134 on the capacitive input sensors 102, 104, 106 are illustrated in FIGS. 1A and 1B, the sensors may detect a change in capacitance from any contact with a user's body, such as contact with a user's palm or face, touches by a stylus or another similar input device, and the like. In some embodiments, a capacitive input sensor 102, 104, 106, 108 may detect two or more contact locations (e.g., a multi-touch sensor). In some embodiments, a capacitive input sensor 102, 104, 106, 108 may detect a pressure of one or more contacts. Outputs from the various capacitive input sensors 102, 104, 106, 108 may be provided to a processor (e.g., a processor that is included within or coupled to the capacitive input sensors 102, 104, 106, 108) that is configured to determine locations of touches that may be treated as user inputs to the mobile computing device 100.

In some embodiments, a processor of the mobile computing device 100 and/or of the capacitive input sensors 102, 104, 106, 108 may determine that one or more contacts have a duration that is less than, equal to, or greater than a threshold period of time. In some embodiments, such a processor may determine whether contacts on the capacitive input sensors 102, 104, 106, 108 are contiguous contacts, such as may be caused by a "swipe," a "gesture," or another similar series of contacts. In some embodiments, the processor of the mobile computing device may distinguish between a tap, a double tap, a long press, a sweep or flick, a drag, a predefined gesture including a plurality of touch and/or pressure inputs, a grip, or any combination thereof. A predefined gesture may be a sequence of one or more of a tap, a double tap, a long tap, a sweep or flick, a drag, a press, a long press, and the like. The predefined gesture may be configured by a user or may be a default gesture. A grip may be a combination of concurrent contacts at multiple locations of the capacitive input sensors 102, 104, 106, 108, which may be persistent for at least a minimum duration. In some embodiments, the capacitive input sensors 102, 104, 106, 108 may be configured to detect a proximity or near-contact (e.g., a "hover") by a user's finger or thumb prior to or without physical contact.

While input sensors 102, 104, 106, 108 are discussed herein generally in terms of capacitive sensors that detect touches based on changes in capacitance, such sensors are used merely as an example of one type of input sensor suitable for use with the various embodiments. Other types of input sensors, such as resistive-sensing input sensors, infrared sensing input sensors, resistive force sensors, etc., may be substituted for capacitive sensing input sensors in various embodiments.

Figure 2:
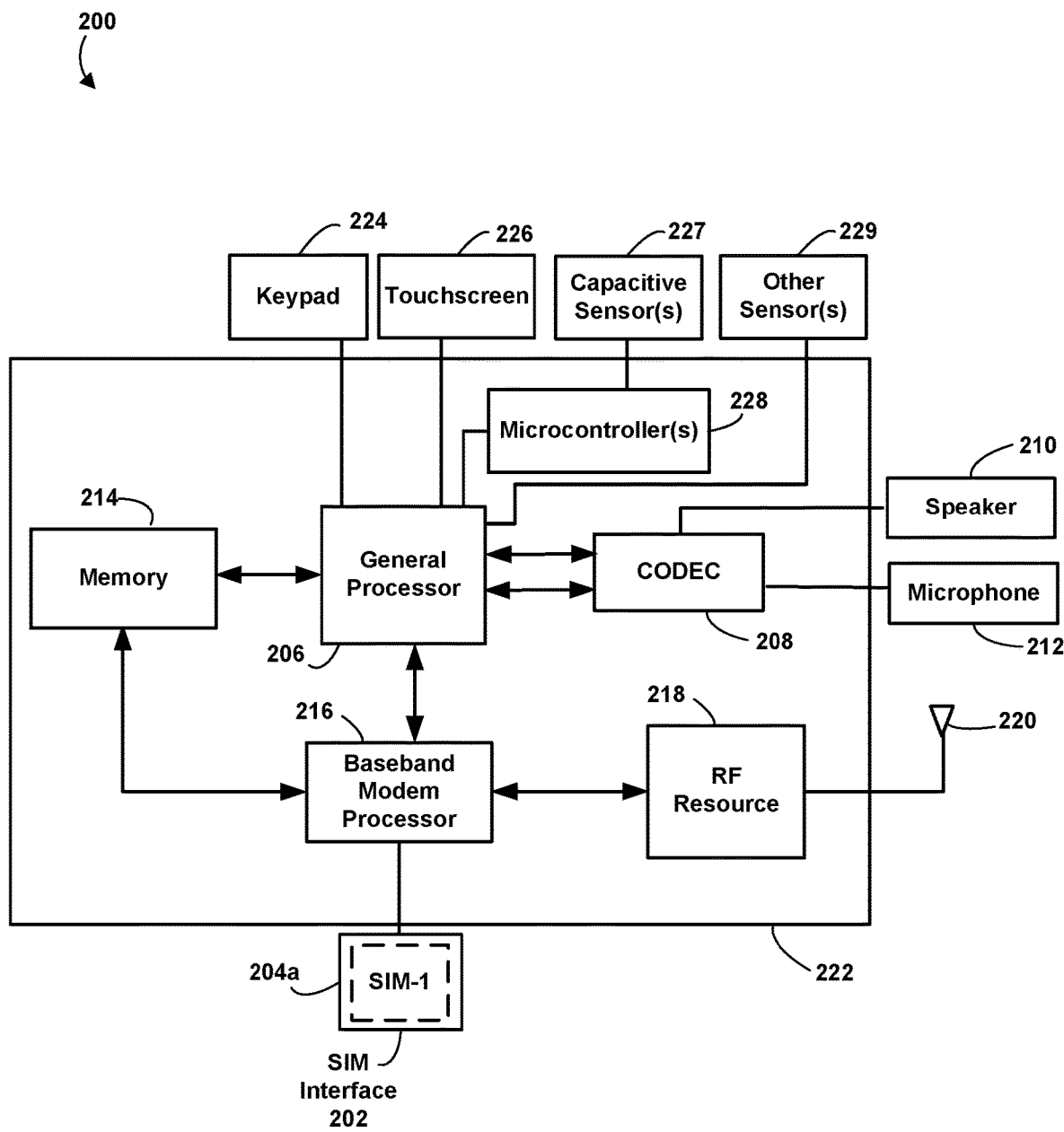
FIG. 2 is a functional block diagram of an example mobile computing device that is suitable for implementing various embodiments.

FIG. 2 is a functional block diagram of an example mobile computing device 200 that is suitable for implementing various embodiments. With reference to FIGS. 1A-2, the mobile computing device 200 may be similar to the mobile computing device 100. For example, the mobile computing device 200 may be a multi-SIM computing device, such as multiple SIM multiple standby (MSMS) computing device. The mobile computing device 200 may include at least one subscriber identity module (SIM) interface 202, which may receive a first SIM ("SIM-1") 204a that is associated with a first subscription. In some aspects, the at least one SIM interface 202 may be implemented as multiple SIM interfaces 202, which may receive at least a second that is associated with at least a second subscription.

A SIM in various aspects may be a Universal Integrated Circuit Card (UICC) that is configured with SIM and/or universal SIM (USIM) applications, enabling access to a variety of different networks. The UICC may also provide storage for a phone book and other applications. Alternatively, in a code division multiple access (CDMA) network, a SIM may be a UICC removable user identity module (R-UIM) or a CDMA subscriber identity module (CSIM) on a card.

Each SIM 204a may have a CPU, ROM, RAM, EEPROM and I/O circuits. One or more of the first SIM 204a and any additional SIMs used in various aspects may contain user account information, an international mobile station identifier (IMSI), a set of SIM application toolkit (SAT) commands and storage space for phone book contacts. One or more of the first SIM 204a and any additional SIMs may further store home identifiers (e.g., a System Identification Number (SID)/Network Identification Number (NID) pair, a Home PLMN (HPLMN) code, etc.) to indicate the SIM network operator provider. An Integrated Circuit Card Identity (ICCID) SIM serial number may be printed on one or more SIM 204a for identification. In some aspects, additional SIMs may be provided for use on the mobile computing device 200 through a virtual SIM (VSIM) application (not shown). For example, the VSIM application may implement remote SIMs on the mobile computing device 200 by provisioning corresponding SIM profiles.

The mobile computing device 200 may include at least one controller, such as a general-purpose processor 206, which may be coupled to a coder/decoder (CODEC) 208. The CODEC 208 may in turn be coupled to a speaker 210 and a microphone 212. The general purpose processor 206 may also be coupled to at least one memory 214. The memory 214 may be a non-transitory tangible computer readable storage medium that stores processor-executable instructions. For example, the instructions may include routing communication data relating to a subscription though the transmit chain and receive chain of a corresponding baseband-RF resource chain. The memory 214 may store operating system (OS), as well as user application software and executable instructions. The general purpose processor 206 and memory 214 may each be coupled to at least one baseband-modem processor 216. Each SIM 204a in the mobile computing device 200 may be associated with a baseband-RF resource chain that includes at least one baseband-modem processor 216 and at least one radio frequency (RF) resource 218.

The RF resource 218 may include receiver and transmitter circuitry coupled to at least one antenna 220, and configured to perform transmit/receive functions for the wireless services associated with each SIM 204a of the computing device 200. The RF resource 218 may implement separate transmit and receive functionalities, or may include a transceiver that combines transmitter and receiver functions. The RF resource 218 may be configured to support multiple radio access technologies/wireless networks that operate according to different wireless communication protocols. The RF resource 218 may include or provide connections to different sets of amplifiers, digital to analog converters, analog to digital converters, filters, voltage controlled oscillators, etc. Multiple antennas 220 and/or receive blocks may be coupled to the RF resource 218 to facilitate multimode communication with various combinations of antenna and receiver/transmitter frequencies and protocols (e.g., LTE, WiFi, Bluetooth and/or the like).

The baseband-modem processor of a mobile computing device 200 may be configured to execute software including at least one modem stack associated with at least one SIM. SIMs and associated modem stacks may be configured to support a variety of communication services that fulfill different user requirements. Further, a particular SIM may be provisioned with information to execute different signaling procedures for accessing a domain of the core network associated with these services and for handling data thereof.

In some aspects, the general purpose processor 206, memory 214, baseband-modem processor 216, and RF resource 218 may be included in a system-on-chip device 222. The SIMs 204a and their corresponding interface(s) 202 may be external to the system-on-chip device 222. Further, various input and output devices may be coupled to components of the system-on-chip device 222, such as interfaces or controllers. Example user input components suitable for use in the mobile computing device 200 may include, but are not limited to, a keypad 224, a touchscreen 226, such as a beveled edge touchscreen, one or more capacitive sensors 227, and one or more other sensors 229. The one or more capacitive sensors 227 may be similar to the capacitive input sensors 102, 104, 106, 108 described with reference to FIGS. 1A and 1B. The one or more other sensors 229 may be any type of sensors available on a mobile computing device, such as, singularly or in combination, one or more accelerometer, one or more camera, one or more pressure sensor, one or more gyroscope, one or more heat sensor, one or more ambient light sensor, and one or more bolometer.

In various aspects, the one or more capacitive sensors 227 may be connected to one or more microcontrollers 228, and the microcontroller(s) 228 may be connected to the general-purpose processor 206. In various aspects, the microcontroller(s) 228 may be configured with microcontroller-executable instructions to perform operations to determine whether a contact is occurring on the one or more capacitive sensors 227. In various aspects, the microcontroller(s) 228 may be configured with microcontroller-executable instructions to perform operations to determine the location of the contact. In various aspects, the microcontroller(s) 228 may be configured with microcontroller-executable instructions to perform operations to send an indication of the contact including contact parameter information to the general purpose processor 206. In various aspects, the general purpose processor 206 may receive an indication of a contact from the microcontroller(s) 228.

Figure 3:
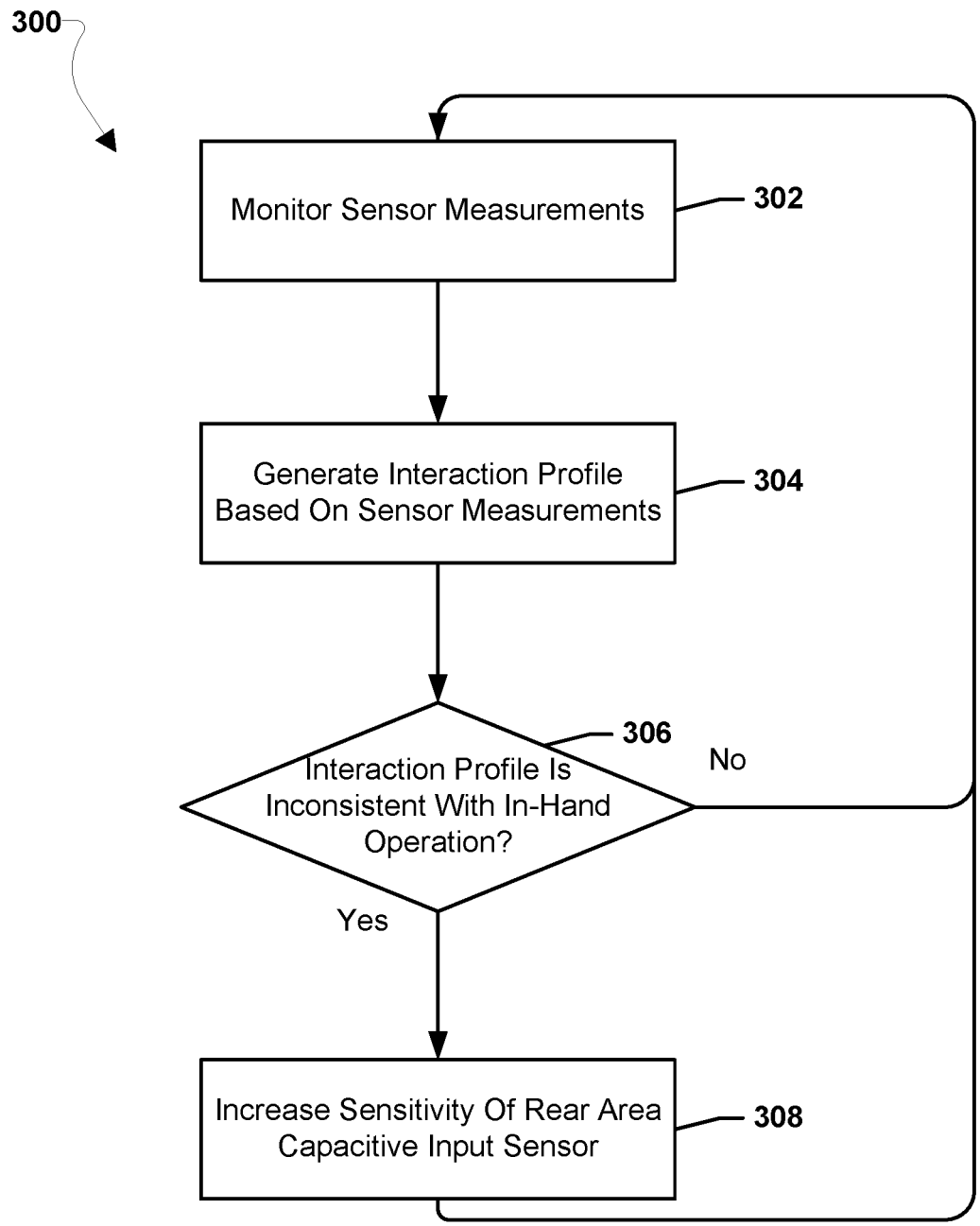
FIG. 3 is a process flow diagram illustrating an embodiment method for contextual operation of a mobile computing device including a rear area capacitive input sensor.

FIG. 3 illustrates an embodiment method 300 for contextual operation of a mobile computing device, such as a mobile computing device (e.g., mobile computing device 100 of FIGS. 1A and 1B, mobile computing device 200 of FIG. 2, etc.) including a rear area capacitive input sensor (e.g., capacitive input sensor 104 of rear area 114 of mobile computing device 100 of FIGS. 1A and 1B, capacitive sensor(s) 227 of mobile computing device 200 of FIG. 2, etc.). In various embodiments, the operations of the method 300 may be performed by a processor (e.g., general purpose processor 206 of mobile computing device 200, etc.) of a mobile computing device, such as a mobile computing device including a rear area capacitive input sensor.

With reference to FIGS. 1A-3, in block 302, the processor may monitor sensor measurements received by the processor from one or more sensors. An example of sensors that may be monitored include one or more capacitive sensors. Another example of sensors that may be monitored include one or more accelerometers. Another example of sensors that may be monitored include one or more cameras. Another example of sensors that may be monitored include one or more microphones. Another example of sensors that may be monitored include one or more gyroscopes. Another example of sensors that may be monitored include one or more heat sensors. Another example of sensors that may be monitored include one or more ambient light sensors. Another example of sensors that may be monitored include one or more bolometers. As a specific example, the processor may monitor rear area capacitive input sensor measurements. Any number or combinations of such sensors may be monitored by the processor.

In block 304, the processor may generate an interaction profile based on the sensor measurements. An interaction profile may be generated based on one or more sensor measurements alone or in combinations, such as capacitive sensor measurements, accelerometer measurements, outputs from a camera, outputs from a microphone, gyroscope measurements, heat sensor measurements, ambient light sensor measurements, bolometer measurements, or any other type of sensor measurements. As a specific example, the processor may generate a capacitive profile based on the rear area capacitive input sensor measurements. As an example, the processor of the mobile computing device may generate a capacitive profile based on the rear area capacitive input sensor measurements by mapping capacitance levels measured by the rear area capacitive input sensor that are at or above a threshold. All, or a portion, of the map of the capacitance levels may be used as the capacitive profile.

In determination block 306, the processor of the mobile computing device may determine whether the interaction profile is inconsistent with in-hand operation. The processor of the mobile computing device may determine whether the interaction profile is inconsistent with in-hand operation by comparing the interaction profile to stored interaction profiles associated with in-hand operation. For example, the processor may compare the interaction profile to one or more of capacitive profiles associated with a mobile computing device being held, such as capacitive profiles of fingers and/or other parts of a hand touching a mobile computing device when the mobile computing device is held. As another example, the processor may compare the interaction profile to acceleration profiles associated with a mobile computing device being held. As another example, the processor may compare the interaction profile to image profiles of fingers or other parts of a hand. As another example, the processor may compare the interaction profile to audio profiles associated with a mobile computing device being held. As another example, the processor may compare the interaction profile to angular velocity profiles associated with a mobile computing device being held. As another example, the processor may compare the interaction profile to temperature profiles associated with a mobile computing device being held. As another example, the processor may compare the interaction profile to light profiles associated with a mobile computing device being held. As another example, the processor may compare the interaction profile to electromagnetic profiles associated with a mobile computing device being held. As another example, the processor may compare the interaction profile to two or more of the sensors profiles associated with a mobile computing device being held.

As an example, the processor of the mobile computing device may determine whether a temperature profile reflects a temperature below a temperature associated with a temperature profile of the mobile computing device being held in a user's hand to determine whether the interaction profile is inconsistent with in-hand operation. As a further example, the processor of the mobile computing device may determine whether an angular velocity profile is different that an angular velocity profile of the mobile computing device when being held by a user to determine whether the interaction profile is inconsistent with in-hand operation. As another example, the processor of the mobile computing device may determine whether a capacitive profile is non-finger shaped to determine whether the interaction profile is inconsistent with in-hand operation.

The processor of the mobile computing device may determine whether the capacitive profile is non-finger shaped by comparing the capacitive profile to stored capacitive profiles of capacitive input sensor outputs when one or more fingers are touching the sensor. As an example, a key in a pocket or bag touching the rear area capacitive input sensor may result in a non-finger matching profile being generated. As another example, a case on the mobile computing device covering all or a portion of the rear area capacitive input sensor may result in generation of a non-finger matching profile. As a further example, the cloth of a pocket or bag touching the rear area capacitive input sensor may result in generating a non-finger matching profile. As a further example, a case may include surfaces or structures that may be interact with the rear area capacitive input sensor and result in generating a non-finger matching profile.

In response to determining that the interaction profile is consistent with in-hand operation (i.e., determination block 306="No"), the processor may continue to monitor sensor measurements in block 302. For example, in response to determining that a capacitive profile is finger shaped, the processor may continue to monitor the rear area capacitive input sensor measurements.

In response to determining that the interaction profile is inconsistent with in-hand operation (i.e., determination block 306="Yes"), the processor may increase a sensitivity of the rear area capacitive input sensor in block 308. For example, the processor of the mobile computing device may increase the sensitivity by increasing a gain of the rear area capacitive input sensor. As another example, the processor of the mobile computing device may increase the sensitivity by adjusting controllable capacitance values for the rear area capacitive input sensor. As another example, the processor of the mobile computing device may increase the sensitivity by making any other hardware and/or software adjustment of the rear area capacitive input sensor that results in increased sensitivity. The increase in sensitivity may enable the rear area capacitive input sensor to detect a user's touch through cloth or other materials that may be covering some or all of the rear area capacitive input sensor. In this manner, the user may able to interact with the rear area capacitive input sensor while the mobile computing device is in a put-away state, such as in a pocket, inside a bag, or in a case or other type covering.

Figure 4:
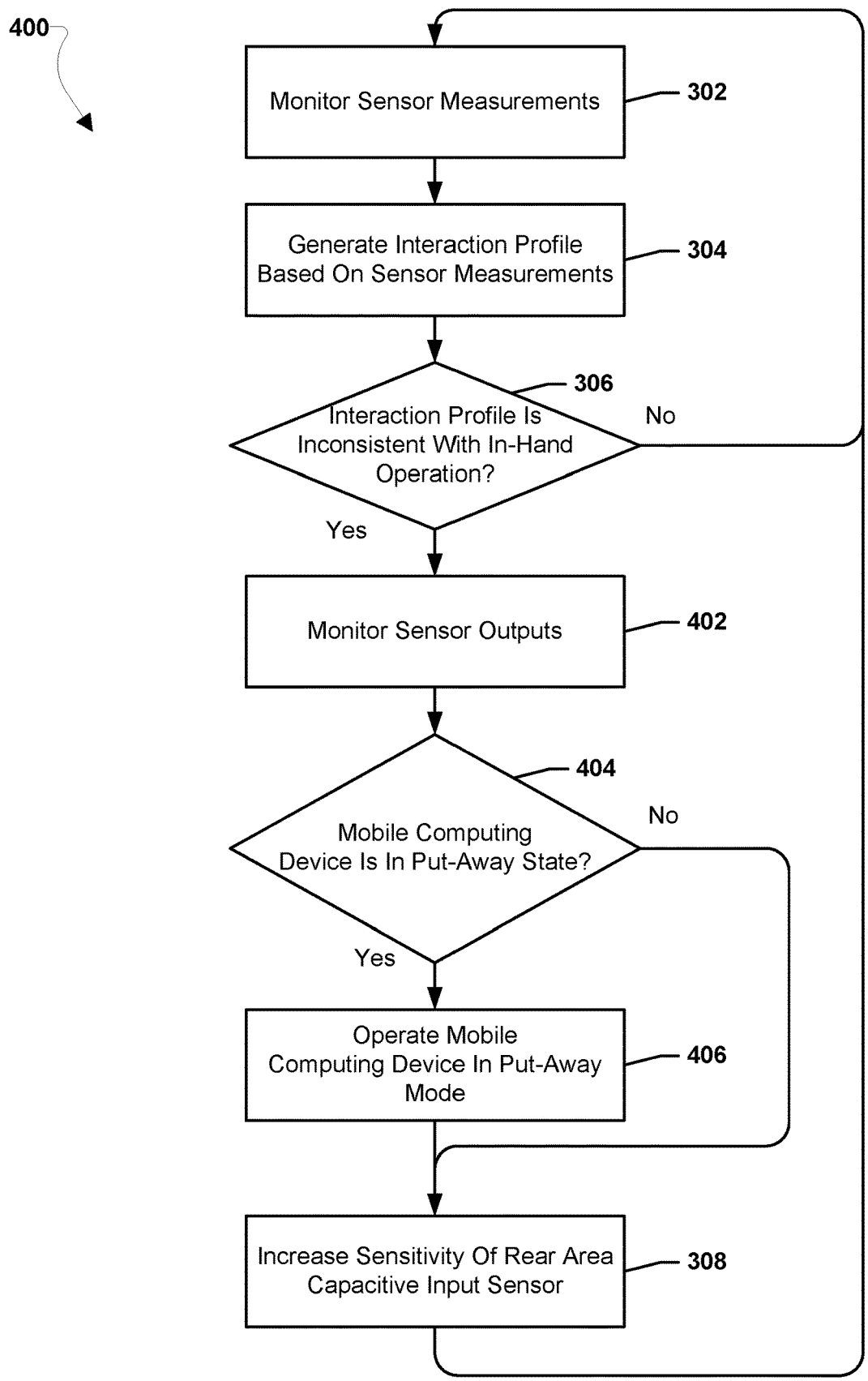
FIG. 4 is a process flow diagram illustrating another embodiment method for contextual operation of a mobile computing device including a rear area capacitive input sensor.

FIG. 4 illustrates an embodiment method 400 for contextual operation of a mobile computing device, such as a mobile computing device (e.g., mobile computing device 100 of FIGS. 1A and 1B, mobile computing device 200 of FIG. 2, etc.) including a rear area capacitive input sensor (e.g., capacitive input sensor 104 of rear area 114 of mobile computing device 100 of FIGS. 1A and 1B, capacitive sensor(s) 227 of mobile computing device 200 of FIG. 2, etc.). In various embodiments, the operations of method 400 may be performed by a processor (e.g., general purpose processor 206 of mobile computing device 200, etc.) of a mobile computing device, such as a mobile computing device including a rear area capacitive input sensor.

With reference to FIGS. 1A-4, in blocks 302, 304, and 306, the processor of the mobile computing device may perform operations of like numbered blocks of method 300 as described with reference to FIG. 3. In response to determining that the interaction profile is inconsistent with in-hand operation (i.e., determination block 306="Yes"), the processor may monitor sensor outputs in block 402. As examples, the processor may monitor, singularly or in any combination, capacitive sensor outputs, accelerometer outputs, camera outputs, touch screen outputs, microphone outputs, pressure sensor outputs, gyroscope outputs, heat sensor outputs, ambient light sensor outputs, and bolometer outputs, or outputs of any other type sensors available on the mobile computing device. Additionally, a sensor output may be a determination as to whether a front screen is on or off. As a specific example, the processor may monitor one or more other sensor outputs from sensors other than a capacitive input sensor in response to determining that a capacitive profile generated based on capacitive input senor measurements inconsistent with in-hand operation because the capacitive profile is not finger shaped.

In determination block 404, the processor of the mobile computing device may determine whether the mobile computing device is in a put-away state. In various embodiments, one or more sensor outputs, such as sensor outputs from, singularly or in any combination, one or more capacitive sensors, one or more accelerometers, one or more cameras, one or more touch screens, one or more microphones, one or more pressure sensors, one or more gyroscopes, one or more heat sensors, one or more ambient light sensors, one or more bolometers, etc., may indicate the mobile computing device is in a put-away state. For example, one or more of the outputs of the sensors may be compared to one or more thresholds, singularly or in combination, and the one or more of the outputs being above or below the thresholds may indicate the mobile computing device is in a put-away state. As a specific example, a camera sensing a threshold level of darkness for a period time while accelerometer movements are detected may indicate the mobile computing device is in a closed bag or pocket. As another specific example, a microphone output being consistent with the shuffling and muffling sounds typical in a pocket or bag may indicate the mobile computing device is in a pocket or bag. As a further specific example, a heat sensor output being slightly elevated while other sensor outputs remain in normal operating condition output ranges may indicate that the mobile computing device has been placed in a protective case or other covering.

In response to determining that the mobile computing device is in the put-away state (i.e., determination block 404="Yes"), the processor of the mobile computing device may operate the mobile computing device in a put-away mode in block 406. In various embodiments, a put-away mode may be a mode of operation in which selected user interactions with the rear area capacitive input sensor may be enabled to control the operation of the mobile computing device. In various embodiments, the selected user interactions may be different user interactions with the rear area capacitive input sensor than may be enabled in various operational contexts (e.g., normal, non-stowed operation). In various embodiments, different gesture profiles may be used on the mobile computing device in the put-away mode than are used in the normal mode. Gesture profiles may associate user interface functions of a mobile computing device with operating modes of the mobile computing device. Operations of a mobile device may be controlled differently in response to the same user interaction with the mobile computing device in put-away mode than in normal mode based on the put-away mode gesture profile being different than the normal mode gesture profile.

An example of selected user interactions that may be enabled in a put-away mode includes allowing a user to apply a gesture to a rear area capacitive input sensor to turn off the ringer/vibration when the mobile computing device is ringing/vibrating. Another example of selected user interactions that may be enabled in a put-away mode includes using a tap or touch on the capacitive input sensor through the outside of pants or a bag to cause the mobile computing device to read out who the call is coming from. Another example of selected user interactions that may be enabled in a put-away mode includes touches or gestures on a rear area capacitive input sensor to toggle silent mode. Another example of selected user interactions that may be enabled in a put-away mode includes touches or gestures on a rear area capacitive input sensor to increase/decrease ringer volume. Another example of selected user interactions that may be enabled in a put-away mode includes touches or gestures on a rear area capacitive input sensor to read out the current time. Such example interactions may be enabled by the put-away mode gesture profile.

In some embodiments, the processor of the mobile computing device may be configured to determine the surface of the mobile computing device that is facing outward in a particular put-away state (e.g., away from a user's body in a pocket, etc.) based on the one or more other sensor outputs. For example, a heat sensor may detect be used by the processor to detect which surface is warmest and the processor may indicate the surface opposite the warmest surface as the outward facing surface. As another example, an ambient light sensor may be used by the processor to determine the surface that is darkest (or lightest), and the processor may indicate the lightest surface or the surface opposite the darkest surface as the outward facing surface.

In some embodiments, the processor of the mobile computing device may be configured to determine the surface of the mobile computing device that is covered by a protective case or other covering. For example, outputs from a heat sensor may be used by the processor to detect an elevated temperature on a surface of the mobile computing device while other sensor outputs may be determined by the processor to remain in normal operating condition output ranges. The processor may determine that the surface with the elevated temperature is the surface covered by a protective case or other covering.

In some embodiments, the processor of the mobile computing device may be configured to adjust an operating state of the hardware of the mobile computing device in various put-away modes. For example, in a put-away mode the mobile computing device processor may activate and/or increase the sensitivity of the capacitive input sensor on a surface of the mobile computing device determined to be the outward facing surface and/or to be the surface covered by a protective case or other covering.

In some embodiments, the processor of the mobile computing device may be configured to learn various user-designated put-away states, such as through a calibration or registration process in which the user places the mobile computing device in a particular put-away state long enough to enable the processor to gather various sensor data to be correlated to the particular put-away state. Such sensor data may be stored in memory and subsequently used as thresholds for determining when the mobile computing device is in a put-away state. In some embodiments, the processor of the mobile computing device may be configured to distinguish between different put-away states, such as by monitoring sensor outputs to distinguish a first put-away state from a second put-away state. For example, the processor may use sensor data from a heat sensor to distinguish the mobile computing device being in a put-away state within a purse or bag from a put-away state in a pocket because the mobile computing device may be warmer when in a pocket than in a bag. In various embodiments, the processor of the mobile computing device may adjust the operating state of the hardware of the mobile computing device based on the gesture profile associated with the various put-away modes.

In embodiments in which the mobile computing device may be connected to another device selected user interactions with the rear area capacitive input sensor that may be enabled in a put-away mode may include allowing touches or gestures to the rear area capacitive sensor to control the interaction with that another device. In some embodiments, the other device may be a wearable device. An example of a wearable device suitable for use with various embodiments is a VR head-mounted display (HMD). Another example of a wearable device suitable for use with various embodiments is AR glasses. For instance, the AR glasses may be showing content and taps on the rear area capacitive input sensor of a pocketed or encased mobile computing device may be used to show/hide AR content, move content, etc.

Additionally, in the put-away mode the processor may alter mobile computing device behaviors by not showing lights and/or making sounds for alerts until it is out of the put-away state (e.g., out of the pocket or the bag and/or turning on the front screen in response to the bag being opened) as may be indicated by the light meter detecting a large change in light levels after a sustained period of darkness). Optionally, in the put-away mode, the user may be given the option to only use vibrate when the mobile computing device is in a pocket. Additionally, certain gestures may be linked to specific responses or functionality in put-away mode. For example, in put-away mode a whole hand touch of the rear area capacitive input sensor through the outside of pants may turn off the ringer as it rings. Similar functionality enabling controlling functionality (e.g., turning off a ringer) may be implemented for mobile computing device in a case, such as when the mobile computing device is on a surface with the touchscreen display down, by sensing user interactions (e.g., a whole hand touch) on the back side of the case.

Additionally, in the put-away mode, stroke or multi-stroke gestures may be performed on the rear area capacitive input sensor to automatically launch specific applications or perform specific actions when the screen is off or on. For example, drawing a "C" with the index finger on the rear area capacitive input sensor when the screen is off may launch the camera. Gripping the mobile computing device in particular ways when the screen is off in put-away mode may automatically launch an associated application. For example, gripping the mobile computing device with both hands in portrait orientation in the put-away mode may launch a messaging application and either allow the user to readily reply to a recent message, or if there was no recent message, allow composing a new message. As another example, gripping the mobile computing device with both hands on the edges and turning it vertically in the put-away mode may launch the camera. As a further example, gripping the mobile computing device with both hands while the rear area capacitive input sensor rests on the index fingers in put-away mode may launch the media player application, a gallery application, or a gaming application based on user preferences. Similar functionality may be implemented for mobile computing device in a case by sensing user interactions (e.g., a grip) with various surfaces of the case.

In response to operating the mobile computing device in put-away mode or in response to determining that the mobile computing device is in the put-away state (i.e., determination block 404="No"), the processor of the mobile computing device may perform operations of like numbered block 308 of the method 300 as described with reference to FIG. 3 to increase the sensitivity of the rear area capacitive input sensor.

Figure 5:
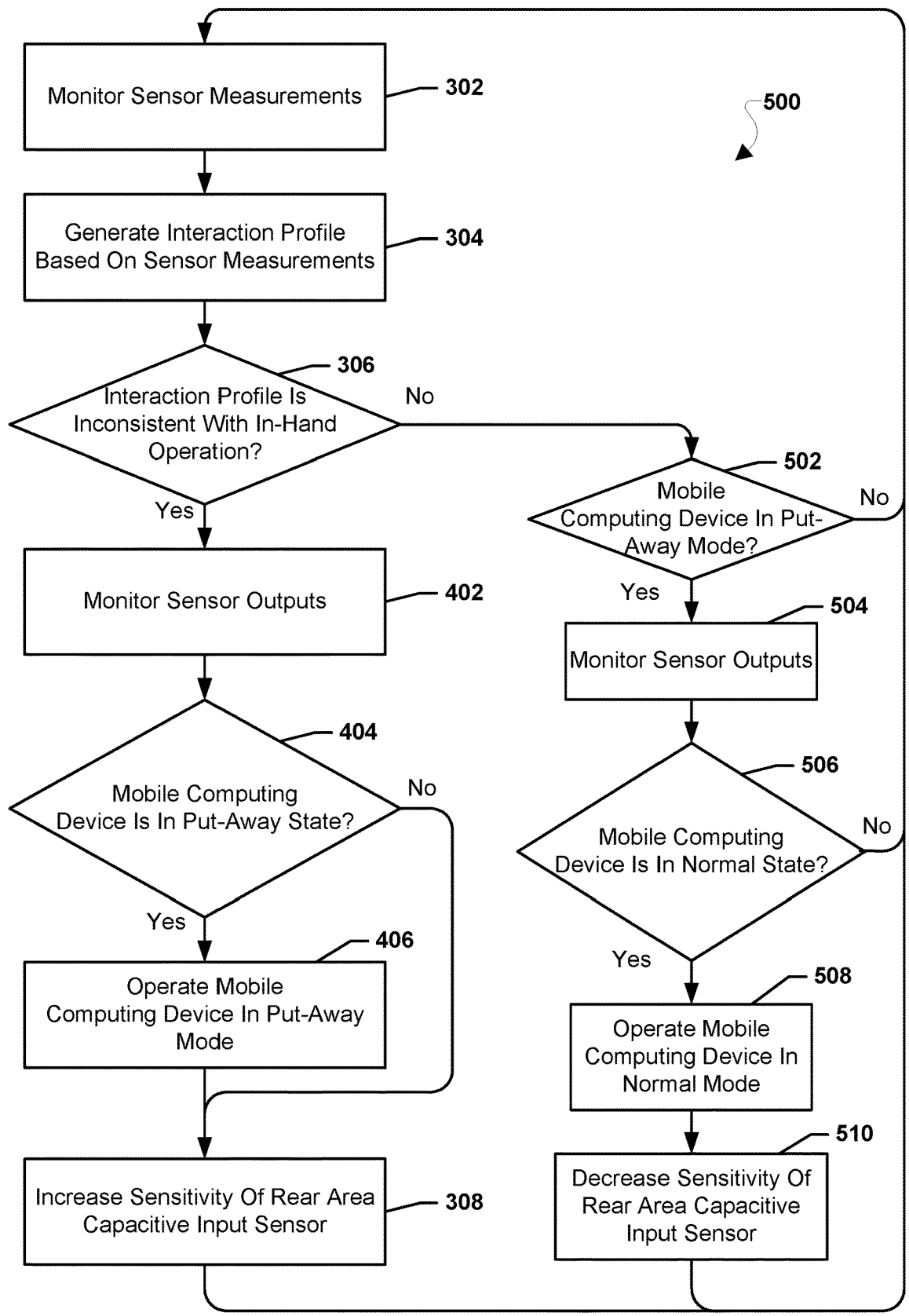
FIG. 5 is a process flow diagram illustrating another embodiment method for contextual operation of a mobile computing device including a rear area capacitive input sensor.

FIG. 5 illustrates an embodiment method 500 for contextual operation of a mobile computing device, such as a mobile computing device (e.g., mobile computing device 100 of FIGS. 1A and 1B, mobile computing device 200 of FIG. 2, etc.) including a rear area capacitive input sensor (e.g., capacitive input sensor 104 of rear area 114 of mobile computing device 100 of FIGS. 1A and 1B, capacitive sensor(s) 227 of mobile computing device 200 of FIG. 2, etc.). In various embodiments, the operations of the method 500 may be performed by a processor (e.g., general purpose processor 206 of mobile computing device 200, etc.) of a mobile computing device including a rear area capacitive input sensor.

With reference to FIGS. 1A-5, in blocks 302, 304, 306, 402, 404, 406, and 308 the processor of the mobile computing device may perform operations of like numbered blocks of the methods 300 and 400 as described with reference to FIGS. 3 and 4.

In response to determining that the interaction profile is consistent with in-hand operation (i.e., determination block 306="Yes"), the processor may determine whether the mobile computing device is in a put-away mode in determination block 502. For example, the processor may check the status of a mode indicator flag or other element in memory to determine whether the mobile computing device is in a put-away mode. In response to determining that the mobile computing device is not in a put-away mode (i.e., determination block 502="No"), the processor may monitor the sensor measurements in block 302.

In response to determining that that the mobile computing device is in a put-away mode (i.e., determination block 502="Yes"), the processor may monitor one or more sensor outputs in block 504. As examples, the processor may monitor, singularly or in any combination, capacitive sensor outputs, accelerometer outputs, camera outputs, touch screen outputs, microphone outputs, pressure sensor outputs, gyroscope outputs, heat sensor outputs, ambient light sensor outputs, and bolometer outputs, or outputs of any other type sensors available on the mobile computing device. Additionally, a sensor output may be a determination as to whether a front screen is on or off. As a specific example, the processor may monitor one or more other sensor outputs from sensors other than a capacitive input sensor in response to determining that the mobile computing device is in a put-away mode.

In determination block 506 the processor may determine whether the mobile computing device is in a normal state. For example, one or more of the outputs of the sensors may be compared to one or more thresholds, singularly or in combination, and one or more of the outputs being above or below the thresholds may indicate the mobile computing device is in a normal state. As a specific example, a light meter or camera sensing a threshold level of light for a threshold period time while accelerometer movements are detected may indicate the mobile computing device is outside a pocket or bag, which may be a normal state for the mobile computing device. As another specific example, a microphone input that is consistent with a user's voice may indicate the mobile computing device is being held near a user's face, which may be a normal state for the mobile computing device. As another example, a light level change detected by a light meter or camera may be interpreted by the processor of the mobile computing device as indicating that the mobile computing device has been removed from a pocket or a bag and is being used in a normal state for the mobile computing device.

In response to determining that the mobile computing device is not in a normal state (i.e., determination block 506="No"), the processor may monitor the sensor measurements in block 302.

In response to determining that the mobile computing device is in a normal state (i.e., determination block 506="Yes"), the processor may operate the mobile computing device in a normal mode in block 508. For example, in response to determining that the one or more sensor outputs indicate that the operating state has changed from put-away to normal, the processor of the computing device may change the operating mode to normal mode. The normal mode may be associated with a normal mode gesture profile that differs from a put-away mode gesture profile. The processor may operate the mobile computing device using the normal mode gesture profile. The selected user interactions in the normal mode, as well as other modes of operation, may be defined in a gesture profile. Gesture profiles may associate user interface functions of a mobile computing device with operating modes of the mobile computing device. For example, in the gesture profile associated with a normal mode touches or gestures on a rear area capacitive input sensor may enlarge the text on a screen of the mobile computing device, while in the gesture profile associated with a pocket put-away mode touches or gestures on a rear area capacitive input sensor may toggle silent mode. Additionally, in the gesture profile for the normal mode, operations of a mobile device may be different than in the gesture profile for a put-away mode, regardless of user interactions. For example, in a normal mode the normal mode gesture profile may cause notifications to be displayed on a screen of the mobile computing device, while in a put-away mode the put-away gesture profile may prevent the display of notifications on the screen.

In block 510 the processor may decrease a sensitivity of the rear area capacitive input sensor suitable for operating in the normal mode. For example, the processor of the mobile computing device may decrease the sensitivity by decreasing a gain of the rear area capacitive input sensor, adjusting controllable capacitance values for the rear area capacitive input sensor, or by making any other hardware and/or software adjustment of the rear area capacitive input sensor that results in decreased sensitivity. The decrease in sensitivity may return the rear area capacitive input sensor to normal mode operations consistent with the normal mode gesture profile.

Figure 6:
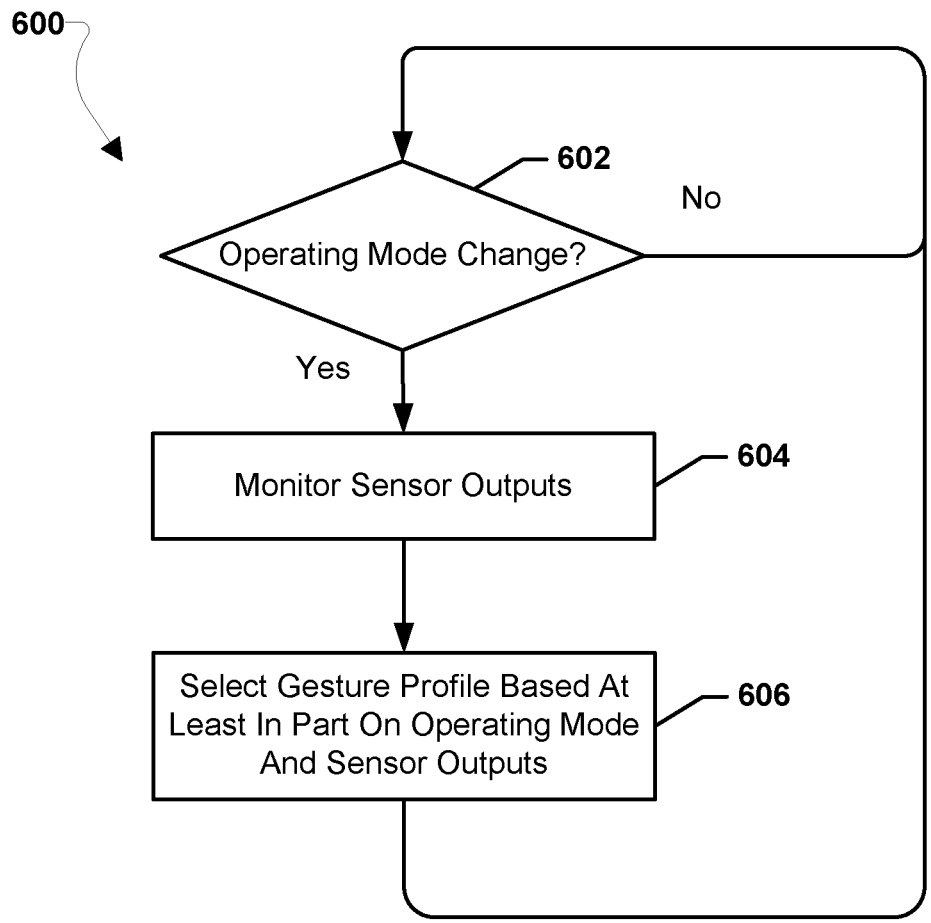
FIG. 6 is a process flow diagram illustrating an embodiment method for selecting a gesture profile.

FIG. 6 illustrates an embodiment method 600 for selecting a gesture profile for use on a mobile computing device, such as a mobile computing device (e.g., mobile computing device 100 of FIGS. 1A and 1B, mobile computing device 200 of FIG. 2, etc.) including a rear area capacitive input sensor (e.g., capacitive input sensor 104 of rear area 114 of mobile computing device 100 of FIGS. 1A and 1B, capacitive sensor(s) 227 of mobile computing device 200 of FIG. 2, etc.). With reference to FIGS. 1A-6, the operations of the method 600 may be performed by a processor (e.g., general purpose processor 206 of mobile computing device 200, etc.) of a mobile computing device, such as a mobile computing device including a rear area capacitive input sensor.

In determination block 602, the processor of the mobile computing device may determine whether an operating mode has changed. Based on the state of the mobile computing the mobile computing device may be operated in different modes, such as normal mode and/or one or more various put-away modes. In response to determining that the operating mode has not changed (i.e., determination block 602="No"), the processor may continue to determine whether the operating mode has changed in determination block 602.

In response to determining that the operating mode has changed (i.e., determination block 602="Yes"), the processor of the computing device may monitor sensor outputs in block 604. As examples, the processor may monitor, singularly or in any combination, accelerometer outputs, camera outputs, touch screen outputs, microphone outputs, pressure sensor outputs, gyroscope outputs, heat sensor outputs, ambient light sensor outputs, and bolometer outputs, capacitive input sensor measurements, or outputs of any other type sensors available on the mobile computing device. Additionally, a sensor output may be a determination as to whether a front screen is on or off.

In block 606, the processor of the mobile computing device may select a gesture profile based at least in part on the operating mode and the sensor outputs. In various embodiments, different gesture profiles may be used on the mobile computing device to control how the mobile computing device responds to different user interactions based on the operational mode. In some embodiments, the processor of the mobile computing device may be configured to distinguish between different put-away states, such as by monitoring sensor outputs to distinguish a first put-away state from a second put-away state. For example, different put-away modes may be distinguished based on the sensor outputs received in the put-away modes and their respective different gesture profiles may be selected accordingly. As a specific example, sensor data from a heat sensor may distinguish the mobile computing device being in a put-away state associated with being in a purse or bag from a put-away state in a pocket because the pocket may be associated with a higher temperature threshold.

Figure 7A:
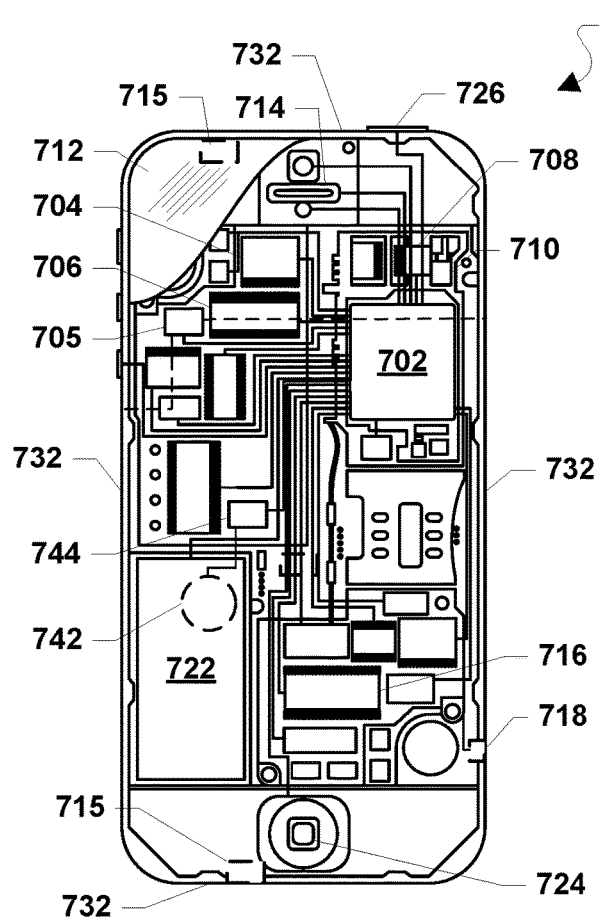
FIGS. 7A and 7B are component block diagrams illustrating an example mobile computing device that is suitable for implementing various embodiments.
Figure 7B:
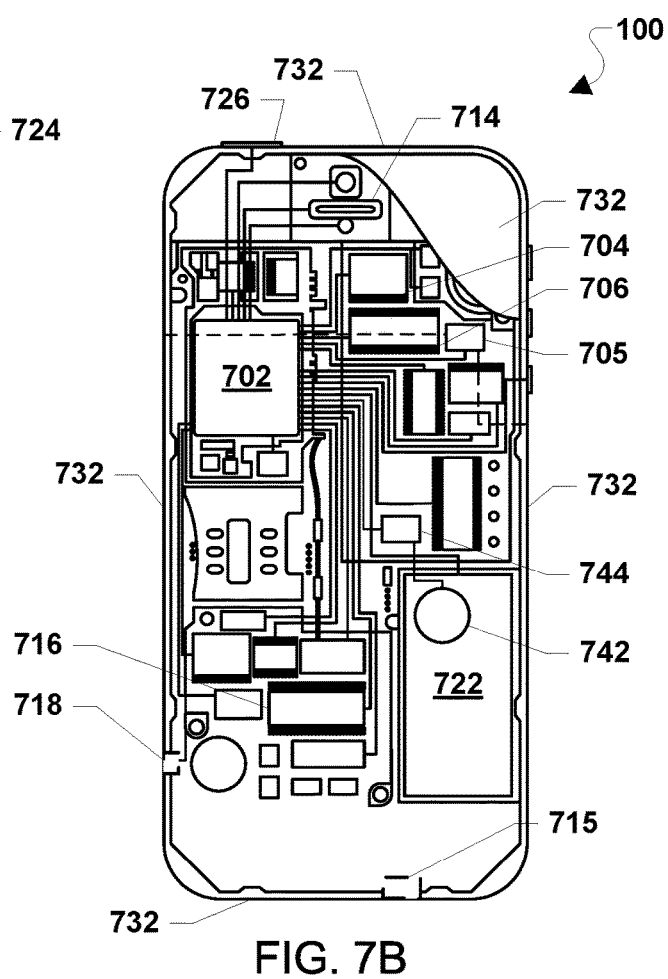

In various embodiments, the processor of the mobile computing device may select a gesture profile for use by the mobile computing device based on the operational context of the mobile computing device. Different gesture profiles may be associated with different put-away states, and based on determining the type of put-away state, the processor of the mobile computing device may select a gesture profile associated with that put-away state type. For example, sensor outputs, such as heat sensor outputs, light sensor outputs, accelerometer outputs, etc., may be used by the processor of the mobile computing device in different operating modes to select the gesture profile. As a specific example, heat sensor and light sensor outputs in a put-away mode may be used by the processor to distinguish between a put-away state in a bag and a put-away state in a pocket, and the processor may select the gesture profile for the pocket put-away state or gesture profile for the bag put-away state for use by the mobile computing device accordingly Various embodiments may be implemented one or more of a variety of mobile computing devices, an example of which in the form of a smartphone is illustrated in FIGS. 7A and 7B. With reference to FIGS. 1-7B, a mobile computing device 100 may include a housing body 110, constructed of a plastic, metal, ceramic, glass, or a combination of such materials, for containing all or some of various components. The mobile computing device 100 may include a processor 702 coupled to various systems and components. In particular, the processor 702 may be coupled to an internal memory 706, a touch screen controller 704, a touch sensor controller 705, radio communication elements, speakers 714, and microphones 715. The processor 702 may be a single core or a multi-core processor designated for general or specific processing tasks. The internal memory 706 may be volatile or non-volatile memory, and may also be secure and/or encrypted memory, or unsecure and/or unencrypted memory, or any combination thereof.

The touch screen controller 704 may be coupled to a touch screen display 712, such as a resistive-sensing touch screen, a capacitive-sensing touch screen, infrared sensing touch screen, etc. A capacitive-sensing touch screen display 712 may include one or more capacitive input sensors (e.g., 102). The touch sensor controller 705 and the processor 702 may be coupled to one or more multi-touch sensors 732, such as capacitive input sensors (e.g., 102, 104, 106). One or more capacitive input sensors 732 may be located on the back panel (e.g., rear area 114), sides (e.g., 116a, 116b), top, and/or bottom of the mobile computing device 100.

The mobile computing device 100 may include one or more radio signal transceivers 708 (e.g., Peanut, Bluetooth, Bluetooth LE, ZigBee, Wi-Fi®, radio frequency (RF) radio, etc.) coupled to antennae 710 for sending and receiving communications. The one or more radio signal transceivers 708 may be coupled to each other and/or to the processor 702. The radio signal transceivers 708 may implement the various wireless transmission protocol stacks and interfaces. For example, the mobile computing device 100 may include a cellular network wireless modem chip 716 coupled to the processor that enables communication via a cellular network.

The mobile computing device 100 may include a peripheral device connection interface 718 coupled to the processor 702. The peripheral device connection interface 718 may be configured to accept one or more types of physical and communication connections, common or proprietary, such as USB, FireWire, Thunderbolt, or PCIe. The peripheral device connection interface 718 may also be coupled to a similarly configured peripheral device connection port (not shown).

The mobile computing device 100 may include a power source 722 (e.g., a battery) coupled to the processor 702, such as a disposable or rechargeable battery. The rechargeable battery may also be coupled to the peripheral device connection port to receive a charging current from a source external to the mobile computing device 100. Additionally, or alternatively, the rechargeable battery may be charged through wireless charging, such as through wireless charging antenna 742. A wireless charging controller 744 may be coupled to the charging antenna 742 and the power source 722 and configured to regulate the charging/recharging of the power source 722 based on a charge state of the power source 722, availability of wireless charging as sensed by the wireless charging antenna 742 and/or control signals received from the processor 702.

In various embodiments, the mobile computing device 100 may include one or more microphones 715. For example, the mobile computing device may have microphones 715 that are conventional for receiving voice or other audio frequency energy from a user during a call. The mobile computing device 100 may also include speakers 714 for providing audio outputs. The mobile computing device 100 may also include one or more physical buttons 724, 726 for receiving user inputs.

The processors described herein may be any programmable microprocessor, microcomputer or multiple processor chip or chips that can be configured by software instructions (applications) to perform a variety of functions, including the functions of various aspects described above. In some devices, multiple processors may be provided, such as one processor dedicated to wireless communication functions and one processor dedicated to running other applications. Typically, software applications may be stored in the internal memory before they are accessed and loaded into the processors. The processors may include internal memory sufficient to store the application software instructions. In many devices the internal memory may be a volatile or nonvolatile memory, such as flash memory, or a mixture of both. For the purposes of this description, a general reference to memory refers to memory accessible by the processors, including internal memory or removable memory plugged into the device and memory within the processor, themselves.

The foregoing method descriptions and the process flow diagrams are provided merely as illustrative examples and are not intended to require or imply that the steps of various embodiments must be performed in the order presented. As will be appreciated by one of skill in the art the order of steps in the foregoing embodiments may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

While the terms "first" and "second" are used herein to describe data transmission associated with a SIM and data receiving associated with a different SIM, such identifiers are merely for convenience and are not meant to limit the various embodiments to a particular order, sequence, type of network or carrier.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The hardware used to implement the various illustrative logics, logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In one or more embodiments, the functions described may be implemented in hardware, software, firmware, or any combination thereof. If implemented in software, the functions may be stored as one or more instructions or code on a non-transitory computer-readable medium or non-transitory processor-readable medium. The steps of a method or algorithm disclosed herein may be embodied in a processor-executable software module, which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the claims. Various modifications to these embodiments will be readily apparent to those skilled in the art, and the generic principles defined herein may be applied to other embodiments without departing from the scope of the claims. Thus, the present disclosure is not intended to be limited to the embodiments shown herein but is to be accorded the widest scope consistent with the following claims and the principles and novel features disclosed herein.

What is claimed is:

1. A method of operating capacitive input sensor of a mobile computing device, comprising:
generating, by a processor of the mobile computing device, an interaction profile based on sensor measurements;
determining, by the processor, whether the interaction profile is inconsistent with in-hand operation;
determining, by the processor, whether the mobile computing device is in a put-away state in response to determining that the interaction profile is inconsistent with in-hand operation; and
operating, by the processor, the mobile computing device in a put-away mode and increasing, by the processor, a sensitivity of a capacitive input sensor in response to determining that the mobile computing device is in the put-away state;
wherein the mobile computing device uses a first gesture profile in the put-away mode that is different than a second gesture profile used in a normal mode;
wherein the first gesture profile and the second gesture profile are configured such that the mobile computing device performs an operation in response to a selected user interaction with the capacitive input sensor in the put-away state that is different from an operation performed by the mobile computing device in response to the same selected user interaction in a normal state; and
wherein in response to the selected user interactions being one or more of a touch, a gesture, or a grip, the operation of the mobile computing device is a control of a wearable device.

2. The method of claim 1, wherein the sensor measurements are received by the processor from one or more of the capacitive input sensor, another capacitive sensor, an accelerometer, a camera, a microphone, a gyroscope, a heat sensor, an ambient light sensor, or a bolometer.

3. The method of claim 1, wherein in response to the selected user interactions being one or more of a touch, a gesture, or a grip, the operation of the mobile computing device is an operation to answer a call, start an application, silence an alert, turn on a screen, read out a message, read out a caller name, launch a camera, toggle a silent mode, adjust a volume, or control another device.

4. The method of claim 1, wherein the wearable device is a virtual reality head-mounted display or augmented reality glasses.

5. The method of claim 1, further comprising:
determining, by the processor, whether the mobile computing device is in a normal state while the mobile computing device is operating in the put-away mode; and
operating, by the processor, the mobile computing device in the normal mode in response to determining that the mobile computing device is in the normal state.

6. The method of claim 1, wherein:
generating the interaction profile based on sensor measurements comprises generating, by the processor, a capacitive profile based on capacitive input sensor measurements;
determining whether the interaction profile is inconsistent with in-hand operation comprises determining, by the processor, whether the capacitive profile is non-finger shaped;
determining whether the mobile computing device is in the put-away state in response to determining that the interaction profile is inconsistent with in-hand operation comprises determining, by the processor, whether one or more other sensor outputs indicate the mobile computing device is in the put-away state in response to determining that the capacitive profile is non-finger shaped; and
operating the mobile computing device in the put-away mode and increasing the sensitivity of the capacitive input sensor in response to determining that the mobile computing device is in the put-away state comprises operating, by the processor, the mobile computing device in the put-away mode and increasing, by the processor, the sensitivity of the capacitive input sensor in response to determining that the one or more other sensor outputs indicate the mobile computing device is in the put-away state.

7. The method of claim 6, wherein the one or more other sensor outputs are received by the processor from one or more of an accelerometer, a camera, a microphone, a gyroscope, a heat sensor, an ambient light sensor, or a bolometer.

8. The method claim 6, further comprising:
determining, by the processor, a surface of the mobile computing device that is an outward surface in the put-away state based at least in part on the one or more other sensor outputs; and
increasing a sensitivity of a capacitive sensor on the outward surface.

9. The method of claim 6, wherein the capacitive input sensor is a rear area capacitive input sensor.

10. The method of claim 9, wherein in the first gesture profile an image associated with an operation of the mobile computing device is not displayed on a screen of the mobile computing device and in the second gesture profile the image associated with the operation is displayed on the screen of the mobile computing device, wherein the screen is a front screen on a side opposite of the rear area capacitive input sensor.

11. The method of claim 1, further comprising:
determining, by the processor, whether additional one or more other sensor outputs indicate the mobile computing device is in a normal state while the mobile computing device is operating in the put-away mode; and
operating, by the processor, the mobile computing device in the normal mode in response to determining that the additional one or more other sensor outputs indicate the mobile computing device is in the normal state.

12. A mobile computing device, comprising:
a housing body;
a capacitive input sensor positioned on the housing body;
a memory; and
a processor within the housing body and coupled to the capacitive input sensor and the memory, wherein the processor is configured with processor-executable instructions to perform operations comprising:
generating an interaction profile based on sensor measurements;
determining whether the interaction profile is inconsistent with in-hand operation;
determining whether the mobile computing device is in a put-away state in response to determining that the interaction profile is inconsistent with in-hand operation;
operating the mobile computing device in a put-away mode and increasing a sensitivity of the capacitive input sensor in response to determining that the mobile computing device is in the put-away state; and
using a first gesture profile in the put-away mode to correlate user input gestures to operations of the mobile computing device while operating in the put-away mode, wherein the first gesture profile is different than a second gesture profile used by the processor to correlate user input gestures to operations of the mobile computing device while operating in a normal mode;
wherein the first gesture profile and the second gesture profile are configured such that the processor causes the mobile computing device to perform an operation in response to a selected user interaction with the capacitive input sensor in the put-away state that is different from an operation performed by the mobile computing device in response to the same selected user interaction in a normal state; and
wherein the processor is further configured with processor-executable instructions to perform operations comprising controlling a wearable device in response to one or more of a touch, a gesture, or a grip user interaction with the capacitive input sensor in the put-away state.

13. The mobile computing device of claim 12, further comprising one or more of an accelerometer, a camera, a microphone, a gyroscope, a heat sensor, an ambient light sensor, or a bolometer, wherein the sensor measurements are received by the processor from one or more of the capacitive input sensor, the accelerometer, the camera, the microphone, the gyroscope, the heat sensor, the ambient light sensor, or the bolometer.

14. The mobile computing device of claim 12, wherein the processor is configured with processor-executable instructions to perform operations such that the operation the processor causes the mobile computing device to perform in response to one or more of a touch, a gesture, or a grip user interaction with the capacitive input sensor in the put-away state is one of answering a call, starting an application, silencing an alert, turning on a screen, reading out a message, reading out a caller name, launching a camera, toggling a silent mode, adjusting a volume, or controlling another device.

15. The mobile computing device of claim 12, wherein the wearable device is a virtual reality head-mounted display or augmented reality glasses.

16. The mobile computing device claim 12, wherein the processor is configured with processor-executable instructions to perform operations further comprising:
  determining whether the mobile computing device is in a normal state while the mobile computing device is operating in the put-away mode; and
  operating the mobile computing device in the normal mode in response to determining that the mobile computing device is in the normal state.

17. The mobile computing device of claim 12, wherein the processor is configured with processor-executable instructions to perform operations such that:
  generating the interaction profile based on sensor measurements comprises generating a capacitive profile based on capacitive input sensor measurements;
  determining whether the interaction profile is inconsistent with in-hand operation comprises determining whether the capacitive profile is non-finger shaped;
  determining whether the mobile computing device is in the put-away state in response to determining that the interaction profile is inconsistent with in-hand operation comprises determining whether one or more other sensor outputs indicate the mobile computing device is in the put-away state in response to determining that the capacitive profile is non-finger shaped; and
  operating the mobile computing device in the put-away mode and increasing the sensitivity of the capacitive input sensor in response to determining that the mobile computing device is in the put-away state comprises operating the mobile computing device in the put-away mode and increasing the sensitivity of the capacitive input sensor in response to determining that the one or more other sensor outputs indicate the mobile computing device is in the put-away state.

18. The mobile computing device of claim 17, further comprising one or more of an accelerometer, a camera, a microphone, a gyroscope, a heat sensor, an ambient light sensor, or a bolometer, wherein the one or more other sensor outputs are received by the processor from one or more of the accelerometer, the camera, the microphone, the gyroscope, the heat sensor, the ambient light sensor, or the bolometer.

19. The mobile computing device claim 17, wherein the processor is configured with processor-executable instructions to perform operations further comprising:
  determining an outward facing surface of the housing body in the put-away state based at least in part on the one or more other sensor outputs; and
  increasing a sensitivity of a capacitive sensor on the outward facing surface of the housing body.

20. The mobile computing device of claim 17, wherein the capacitive input sensor is positioned on a rear area of the housing body.

21. The mobile computing device of claim 20, further comprising a screen coupled to the processor and positioned on a front side of the housing body opposite the rear area of the housing body on which the capacitive input sensor is positioned, wherein the processor is configured with processor-executable instructions to perform operations such that in the first gesture profile an image associated with an operation of the mobile computing device is not displayed on the screen and in the second gesture profile the image associated with the operation is displayed on the screen.

22. The mobile computing device of claim 12, wherein the processor is configured with processor-executable instructions to perform operations further comprising:
  determining whether additional one or more other sensor outputs indicate the mobile computing device is in a normal state while the mobile computing device is operating in the put-away mode; and
  operating the mobile computing device in the normal mode in response to determining that the additional one or more other sensor outputs indicate the mobile computing device is in the normal state.

23. A non-transitory, processor-readable medium having stored thereon processor-executable instructions configured to cause a processor of a mobile computing device to perform operations comprising:
  generating an interaction profile based on sensor measurements;
  determining whether the interaction profile is inconsistent with in-hand operation;
  determining whether the mobile computing device is in a put-away state in response to determining that the interaction profile is inconsistent with in-hand operation;
  operating the mobile computing device in a put-away mode and increasing a sensitivity of a capacitive input sensor in response to determining that the mobile computing device is in the put-away state; and
  using a first gesture profile in the put-away mode to correlate user input gestures to operations of the mobile computing device while operating in the put-away mode, wherein the first gesture profile is different than a second gesture profile used by the processor to correlate user input gestures to operations of the mobile computing device while operating in a normal mode;
  wherein the stored processor-executable instructions are configured to cause the processor to perform operations such that the first gesture profile and the second gesture profile are configured such that the mobile computing device performs an operation in response to a selected user interaction with the capacitive input sensor in the put-away state that is different from an operation performed by the mobile computing device in response to the same selected user interaction in a normal state;
  wherein the stored processor-executable instructions are configured to cause the processor to perform operations further comprising controlling a wearable device in response to one or more of a touch, a gesture, or a grip user interaction with the capacitive input sensor in the put-away state.

24. The non-transitory, processor-readable medium of claim 23, wherein the stored processor-executable instructions are configured to cause the processor to perform operations further comprising receiving the sensor measurements from one or more of the capacitive input sensor, another capacitive sensor, an accelerometer, a camera, a microphone, a gyroscope, a heat sensor, an ambient light sensor, or a bolometer.

25. The non-transitory, processor-readable medium of claim 23, wherein the stored processor-executable instructions are configured to cause the processor to perform operations such that the operation the processor causes the mobile computing device to perform in response to one or more of a touch, a gesture, or a grip user interaction with the capacitive input sensor in the put-away state is one of answering a call, starting an application, silencing an alert, turning on a screen, reading out a message, reading out a caller name, launching a camera, toggling a silent mode, adjusting a volume, or controlling another device.

26. The non-transitory, processor-readable medium claim 23, wherein the stored processor-executable instructions are configured to cause the processor to perform operations further comprising:
determining whether the mobile computing device is in a normal state while the mobile computing device is operating in the put-away mode; and
operating the mobile computing device in the normal mode in response to determining that the mobile computing device is in the normal state.

27. The non-transitory, processor-readable medium of claim 23, wherein the stored processor-executable instructions are configured to cause the processor to perform operations such that:
generating the interaction profile based on sensor measurements comprises generating a capacitive profile based on capacitive input sensor measurements;
determining whether the interaction profile is inconsistent with in-hand operation comprises determining whether the capacitive profile is non-finger shaped;
determining whether the mobile computing device is in the put-away state in response to determining that the interaction profile is inconsistent with in-hand operation comprises determining whether one or more other sensor outputs indicate the mobile computing device is in the put-away state in response to determining that the capacitive profile is non-finger shaped; and
operating the mobile computing device in the put-away mode and increasing the sensitivity of the capacitive input sensor in response to determining that the mobile computing device is in the put-away state comprises operating the mobile computing device in the put-away mode and increasing the sensitivity of the capacitive input sensor in response to determining that the one or more other sensor outputs indicate the mobile computing device is in the put-away state.

28. The non-transitory, processor-readable medium of claim 27, wherein the stored processor-executable instructions are configured to cause the processor to perform operations further comprising receiving the one or more other sensor outputs from one or more of an accelerometer, a camera, a microphone, a gyroscope, a heat sensor, an ambient light sensor, or a bolometer.

29. The non-transitory, processor-readable medium of claim 27, wherein the stored processor-executable instructions are configured to cause the processor to perform operations further comprising:
determining, by the processor, a surface of the mobile computing device that is an outward surface in the put-away state based at least in part on the one or more other sensor outputs; and
increasing a sensitivity of a capacitive sensor on the outward surface.

30. The non-transitory, processor-readable medium of claim 27, wherein the stored processor-executable instructions are configured to cause the processor to perform operations such that an image associated with an operation of the mobile computing device is not displayed on a screen of the mobile computing device while in the put-away mode and the image associated with the operation is displayed on the screen of the mobile computing device while in the normal mode.

31. The non-transitory, processor-readable medium of claim 23, wherein the stored processor-executable instructions are configured to cause the processor to perform operations further comprising:
determining whether additional one or more other sensor outputs indicate the mobile computing device is in a normal state while the mobile computing device is operating in the put-away mode; and
operating the mobile computing device in the normal mode in response to determining that the additional one or more other sensor outputs indicate the mobile computing device is in the normal state.

32. A mobile computing device, comprising:
a housing body;
a capacitive input sensor positioned on the housing body;
means for generating an interaction profile based on sensor measurements;
means for determining whether the interaction profile is inconsistent with in-hand operation;
means for determining whether the mobile computing device is in a put-away state in response to determining that the interaction profile is inconsistent with in-hand operation;
means for operating the mobile computing device in a put-away mode and increasing a sensitivity of a capacitive input sensor in response to determining that the mobile computing device is in the put-away state;
means for using a first gesture profile in the put-away mode to correlate user input gestures to operations of the mobile computing device while operating in the put-away mode, wherein the first gesture profile is different than a second gesture profile used to correlate user input gestures to operations of the mobile computing device while operating in a normal mode;
means for performing an operation in response to a selected user interaction with the capacitive input sensor in the put-away state that is different from an operation performed in response to the same selected user interaction in a normal state; and
means for controlling a wearable device in response to one or more of a touch, a gesture, or a grip user interaction with the capacitive input sensor in the put-away state.

33. The mobile computing device of claim 32, further comprising:
means for determining whether additional one or more other sensor outputs indicate the mobile computing device is in a normal state while the mobile computing device is operating in the put-away mode; and
means for operating the mobile computing device in the normal mode in response to determining that the additional one or more other sensor outputs indicate the mobile computing device is in the normal state.

34. The mobile computing device of claim 32, wherein:
means for generating the interaction profile based on sensor measurements comprises means for generating a capacitive profile based on capacitive input sensor measurements;
means for determining whether the interaction profile is inconsistent with in-hand operation comprises means for determining whether the capacitive profile is non-finger shaped;
means for determining whether the mobile computing device is in the put-away state in response to determining that the interaction profile is inconsistent with in-hand operation comprises means for determining whether one or more other sensor outputs indicate the mobile computing device is in the put-away state in response to determining that the capacitive profile is non-finger shaped; and means for operating the mobile computing device in a put-away mode and increasing a sensitivity of a capacitive input sensor in response to determining that the mobile computing device is in the put-away state comprises means for operating the mobile computing device in the put-away mode and increasing the sensitivity of the capacitive input sensor in response to determining that the one or more other sensor outputs indicate the mobile computing device is in the put-away state.

\* \* \* \* \*